US012656920B2

(12) United States Patent
Yoo

(10) Patent No.: US 12,656,920 B2
(45) Date of Patent: Jun. 16, 2026

(54) DISPLAY DEVICE AND ELECTRONIC DEVICE INCLUDING THE SAME

(71) Applicant: SAMSUNG DISPLAY CO., LTD., Yongin-si (KR)

(72) Inventor: Gi Na Yoo, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 18/977,563

(22) Filed: Dec. 11, 2024

(65) Prior Publication Data

US 2025/0383745 A1 Dec. 18, 2025

(30) Foreign Application Priority Data

Jun. 17, 2024 (KR) ........................ 10-2024-0078457

(51) Int. Cl.
*G06F 3/044* (2006.01)
*H10K 59/40* (2023.01)

(52) U.S. Cl.
CPC ........... *G06F 3/0446* (2019.05); *H10K 59/40* (2023.02); *G06F 2203/04112* (2013.01)

(58) Field of Classification Search
CPC ......... G06F 3/0446; G06F 2203/04112; G06F 3/0443; G06F 3/0412; G06F 1/1643; G06F 1/1626; G06F 2203/04111; H10K 59/40; H10K 59/8791; H10K 59/131; H10K 59/8731
See application file for complete search history.

(56) References Cited

U.S. PATENT DOCUMENTS

| | | | |
|---|---|---|---|
| 11,133,355 B2 | 9/2021 | Park et al. | |
| 11,366,558 B2 | 6/2022 | Moy et al. | |
| 2021/0255723 A1* | 8/2021 | Kim ...................... | H10K 59/12 |
| 2024/0284749 A1 | 8/2024 | Park et al. | |

FOREIGN PATENT DOCUMENTS

| | | |
|---|---|---|
| CN | 111913605 A | 11/2020 |
| CN | 117331449 A | 1/2024 |
| KR | 10-2023-0050295 A | 4/2023 |

* cited by examiner

*Primary Examiner* — Deeprose Subedi
(74) *Attorney, Agent, or Firm* — F. CHAU & ASSOCIATES, LLC

(57) ABSTRACT

A display device includes a panel layer including pixels disposed in a display area, and an input sensing layer disposed on the panel layer. The input sensing layer includes a sensing electrode including mesh lines defining mesh openings corresponding to the pixels. The mesh lines include first mesh lines extending in a first direction and second mesh lines extending in a second direction. The first mesh lines and the second mesh lines intersect each other at intersection points. In some of the mesh lines, a cut point is defined between two adjacent intersection points. In a mesh line in which the cut point is not defined between two adjacent intersection points among the mesh lines, a compensation pattern protruding from side surfaces of the mesh line is defined. The compensation pattern includes a through-hole pattern positioned at a central portion of the compensation pattern.

20 Claims, 26 Drawing Sheets

TE': TE1', TE2'          CP': CP1', CP2'
OP: OP1, OP2, OP3          HP': HP1', HP2'
CUT': CUT1', CUT2'

1000

DISPLAY DEVICE AND ELECTRONIC DEVICE INCLUDING THE SAME

CROSS-REFERENCE TO RELATED APPLICATION

This application claims priority under 35 U.S.C. § 119 to Korean Patent Application No. 10-2024-0078457, filed in the Korean Intellectual Property Office on Jun. 17, 2024, the entire contents of which are herein incorporated by reference.

TECHNICAL FIELD

The present disclosure relates to a display device and an electronic device including the display device.

DISCUSSION OF THE RELATED ART

A display device may include a display area in which an image is displayed, and a sensing area capable of detecting a touch input of a user. The display area and the sensing area may overlap each other in a plan view. In this case, a touch input of a user of the display device may be detected in the display area in which an image is displayed.

SUMMARY

A display device includes a panel layer including pixels disposed in a display area, and an input sensing layer disposed on the panel layer. The input sensing layer includes a sensing electrode including mesh lines defining mesh openings corresponding to the pixels. The mesh lines include first mesh lines extending in a first direction and second mesh lines extending in a second direction intersecting the first direction. The first mesh lines and the second mesh lines intersect each other at intersection points. In some mesh lines of the mesh lines, a cut point is defined between two adjacent intersection points. In a mesh line in which the cut point is not defined between two adjacent intersection points, among the mesh lines, a compensation pattern protruding from side surfaces of the mesh line is defined, and the compensation pattern includes a through-hole pattern positioned at a central portion of the compensation pattern.

The mesh lines might not overlap emission areas of the pixels in a plan view.

The sensing electrode may be divided into a first sensing electrode and a second sensing electrode by the cut point.

A maximum width of the through-hole pattern in the first direction may be 80% or more of a width of the second mesh line in the first direction.

A maximum width of the through-hole pattern in the second direction may be 80% or more of a width of the first mesh line in the second direction.

The compensation pattern may have a quadrilateral shape with rounded corners in a plan view.

The through-hole pattern may have a circular shape, a polygonal shape, or a polygonal shape with rounded corners in a plan view.

The cut point may include first cut points defined in the first mesh lines and second cut points defined in the second mesh lines, and the compensation pattern may include first compensation patterns defined in the first mesh lines and second compensation patterns defined in the second mesh lines.

In the mesh lines, the first cut points and the first compensation patterns may be arranged in a line in the second direction.

In the mesh lines, the second cut points and the second compensation patterns may be arranged in a line in the first direction.

The pixels may be arranged in a matrix form in the first direction and the second direction.

A display device includes a panel layer including pixels arranged in a display area, and an input sensing layer disposed on the panel layer. The input sensing layer includes a sensing electrode including openings corresponding to the pixels. In some openings of the openings, a cut point is defined in the sensing electrode positioned in an area between two adjacent openings to connect the two adjacent openings to one another. Between the two adjacent openings among the openings, a compensation pattern protruding from side surfaces of the sensing electrode is defined in the sensing electrode positioned in an area in which the cut point is not defined. The compensation pattern includes a through-hole pattern positioned at a central portion of the compensation pattern.

The sensing electrode might not overlap emission areas of the pixels in a plan view.

The sensing electrode may be divided into a first sensing electrode and a second sensing electrode by the cut point.

The openings may include first openings, second openings, and third openings, and a planar area of each of the third openings may be greater than a planar area of each of the first openings and a planar area of each of the second openings.

The cut point may include a first cut point defined between the first opening and the second opening adjacent to each other, between the first opening and the third opening adjacent to each other, and between the second opening and the third opening adjacent to each other, and a second cut point defined between the third openings adjacent to each other.

A width of the sensing electrode in an area in which the first cut point is defined may be smaller than a width of the sensing electrode in an area in which the second cut point is defined.

The compensation pattern may include a first compensation pattern defined between the first opening and the second opening adjacent to each other, between the first opening and the third opening adjacent to each other, and between the second opening and the third opening adjacent to each other. A second compensation pattern may be defined between two third openings adjacent to each other.

A planar area of a first through-hole pattern positioned at a central portion of the first compensation pattern may be smaller than a planar area of a second through-hole pattern positioned at a central portion of the second compensation pattern.

An electronic device includes a processor configured to provide input image data, a display device configured to display an image based on the input image data, and a power supply configured to supply power to the display device. The display device includes a panel layer including pixels disposed in a display area, and an input sensing layer disposed on the panel layer. The input sensing layer includes a sensing electrode including mesh lines configured to define mesh openings corresponding to the pixels. The mesh lines include first mesh lines extending in a first direction and second mesh lines extending in a second direction intersecting the first direction. The first mesh lines and the second mesh lines intersect each other at intersection points. In each of some mesh lines of the mesh lines, a cut point is defined between two adjacent intersection points. In a mesh line in which the cut point is not defined between two adjacent intersection points, among the mesh lines, a compensation pattern protruding from side surfaces of the mesh line is defined. The compensation pattern includes a through-hole pattern positioned at a central portion of the compensation pattern.

BRIEF DESCRIPTION OF THE DRAWINGS

A more complete appreciation of the present disclosure and many of the attendant aspects thereof will be readily obtained as the same becomes better understood by reference to the following detailed description when considered in connection with the accompanying drawings, wherein:

FIG. 3 is a plan view illustrating the panel layer of FIG. 2.

FIG. 6 is a plan view illustrating the input sensing layer of FIG. 2.

FIG. 21 is a plan view illustrating an embodiment of the panel layer of FIG. 2.

FIG. 22 is a plan view illustrating an embodiment of the input sensing layer of FIG. 2.

DETAILED DESCRIPTION OF THE EMBODIMENTS

Figure 1:
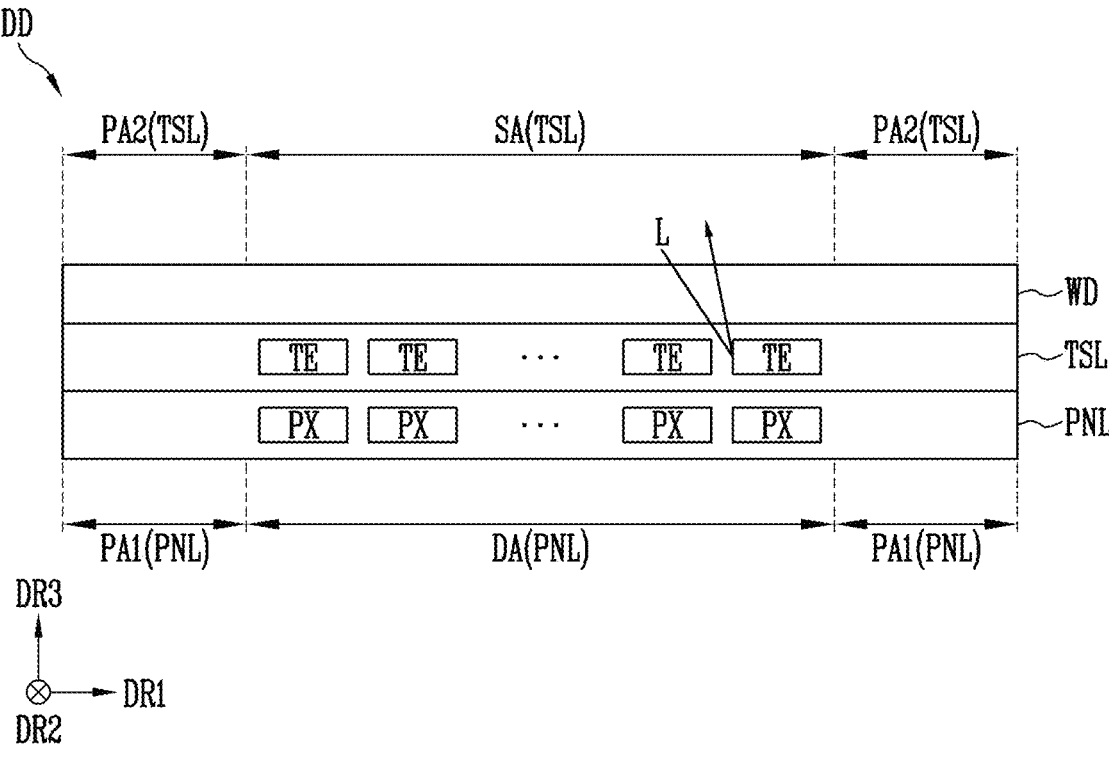
FIG. 1 is a cross-sectional view illustrating a display device according to embodiments of the present invention.

Hereinafter, embodiments according to the present invention will be described in detail with reference to the attached drawings. In the following description, it should be noted that portions required for comprehension of operations according to the present invention will be described. In addition, the present invention is not necessarily limited to the following described embodiments but may also be embodied in other forms. Rather, these embodiments are provided so that the present invention will be thorough, and complete, and will fully convey the present invention to those skilled in the art.

Throughout the specification, it will be understood that when an element is referred to as being "coupled" or "connected" to another element, it can be directly coupled or connected to the other element or intervening elements may be present therebetween. Throughout the specification, unless explicitly described to the contrary, the word "comprise" and variations such as "comprises" or "comprising" will be understood to imply the inclusion of stated elements but not the exclusion of any other elements. As used herein, "and/or" includes one or more combinations of corresponding components.

It will be understood that, although the terms "first," "second," "third," and so on may be used herein to describe various elements, these elements are not necessarily limited by these terms. These terms are used to distinguish one element from another element. Thus, a first element described below could also be termed as a second or third element without departing from the spirit and scope of the present invention.

Spatially relative terms, such as "beneath," "below," "lower," "above," "upper," and the like, may be used herein for descriptive purposes, and, thereby, to describe one element or feature's relationship to another element(s) or feature(s) as shown in the drawings. Spatially relative terms are intended to encompass different orientations of a device in use, operation, and/or manufacture in addition to the orientation depicted in the drawings. For example, if the device in the drawings is turned over, elements described as "below" or "beneath" other elements or features would then be oriented "above" the other elements or features. Thus, in one embodiment, the exemplary term "below" can encompass both an orientation of above and below. directions. Furthermore, the device may be otherwise oriented (e.g., rotated 90 degrees or at other orientations), and, as such, the spatially relative descriptors used herein interpreted accordingly.

While each drawing may represent one or more particular embodiments of the present disclosure, drawn to scale, such that the relative lengths, thicknesses, and angles can be inferred therefrom, it is to be understood that the present invention is not necessarily limited to the relative lengths, thicknesses, and angles shown. Changes to these values may be made within the spirit and scope of the present disclosure, for example, to allow for manufacturing limitations and the like.

FIG. 1 is a cross-sectional view illustrating a display device according to embodiments of the present invention.

Referring to FIG. 1, a display device DD may include a panel layer PNL, an input sensing layer TSL, and a window WD.

The panel layer PNL may include pixels PX. The pixel PX may emit light. A plurality of pixels PX may be provided, and the display device DD may display an image by combining pieces of light emitted from the pixels PX.

An area of the panel layer PNL in which the pixels PX are disposed may be referred to as a display area DA. An area of the panel layer PNL in which the pixels PX are not disposed may be referred to as a first peripheral area PA1. Various components (for example, electrodes, circuits, and interconnects) may be disposed in the first peripheral area PA1 to provide various types of electrical signals to the pixels PX.

The input sensing layer TSL may be disposed on the panel layer PNL. The input sensing layer TSL may include a sensing electrode TE. A plurality of sensing electrodes TE may be provided, and the display device DD may detect a touch input of a user through the sensing electrodes TE.

An area of the input sensing layer TSL in which the sensing electrodes TE are disposed may be referred to as a sensing area SA. An area of the input sensing layer TSL in which the sensing electrodes TE are not disposed may be referred to as a second peripheral area PA2. Various components (for example, electrodes, circuits, and interconnects) may be disposed in the second peripheral area PA2 to transmit input signals detected from the sensing electrodes TE or provide various types of electrical signals to the pixels PX and/or the sensing electrodes TE.

As shown in FIG. 1, the display area DA of the panel layer PNL and the sensing area SA of the input sensing layer TSL may substantially overlap each other. Accordingly, a touch input of a user of the display device DD may be detected in the display area DA in which an image is displayed.

In this case, the sensing electrodes TE may be provided so as not to overlap the pixels PX in a plan view. For example, the sensing electrodes TE may be provided as mesh lines that do not overlap the pixels PX in a plan view or may have openings corresponding to the pixels PX. Accordingly, light emitted from the pixels PX might not be substantially blocked by the sensing electrodes TE. The plan view may refer to a view of a plane defined by first and second directions DR1 and DR2 that intersect each other and are perpendicular to a third direction DR3 which is a stacking direction of the panel layer PNL, the touch sensing layer TSL, and the window WD included in the display device DD.

The window WD may be disposed on the touch sensing layer TSL. The window WD may include a material that has relatively high rigidity and relatively high light transmittance, e.g., a rigid and transparent material.

In one embodiment, as shown in FIG. 1, external light L may be incident. The external light L may be reflected on side surfaces of the sensing electrodes TE. In this case, a user of the display device DD may view a reflection pattern. The reflection pattern may cause a problem in that the visibility of the display device DD is degraded.

Hereinafter, the configurations of the present invention for preventing the above-described degradation in visibility will be described.

Figure 2:
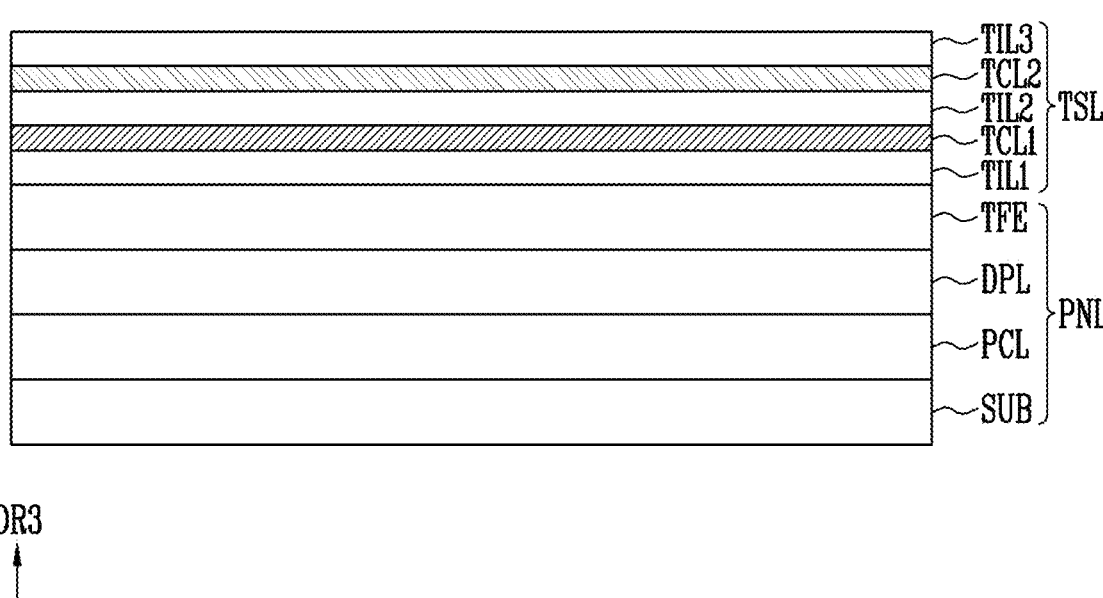
FIG. 2 is a cross-sectional view illustrating a panel layer and an input sensing layer included in the display device of FIG. 1.

FIG. 2 is a cross-sectional view illustrating the panel layer and the input sensing layer included in the display device of FIG. 1.

Referring to FIG. 2, the panel layer PNL may include a substrate SUB, a circuit layer PCL, a display layer DPL, and an encapsulation layer TFE.

The substrate SUB may be rigid or flexible. The substrate SUB may include various materials such as glass and plastic.

The circuit layer PCL may be disposed on the substrate SUB. The circuit layer PCL may include one or more transistors and one or more capacitors. In addition, the circuit layer PCL may further include various types of interconnects and various types of electrodes. The circuit layer PCL may include insulating layers sequentially stacked in the third direction DR3, and conductive patterns and/or semiconductor patterns interposed between two adjacent insulating layers.

The display layer DPL may include various components that may emit light based on electrical signals provided from the circuit layer PCL. For example, when the display device DD is provided as an organic light-emitting display device, the display layer DPL may include an anode, a cathode, and an organic emission layer interposed between the anode and the cathode.

The encapsulation layer TFE may be disposed on the display layer DPL. The encapsulation layer TFE may cover the display layer DPL and the circuit layer PCL. The encapsulation layer TFE may serve to protect components disposed below the encapsulation layer TFE from impurities (for example, moisture or moisture).

The input sensing layer TSL may include a first insulating layer TIL1, a first sensing conductive layer TCL1, a second insulating layer TIL2, a second sensing conductive layer TCL2, and a third insulating layer TIL3 which are sequentially stacked in the third direction DR3.

The first to third insulating layers TIL1, TIL2, and TIL3 may include an insulating material. For example, the first to third insulating layers TIL1, TIL2, and TIL3 may each independently include silicon nitride, silicon oxide, silicon oxynitride, and/or aluminum oxide.

The first and second sensing conductive layers TCL1 and TCL2 may include a conductive material. For example, the first and second sensing conductive layers TCL1 and TCLT2 may each independently include silver (Ag), magnesium (Mg), aluminum (Al), platinum (Pt), palladium (Pd), gold, (Au), nickel (Ni), neodymium (Nd), iridium (Ir), chromium (Cr), titanium (Ti), and/or an alloy thereof.

Figure 3:
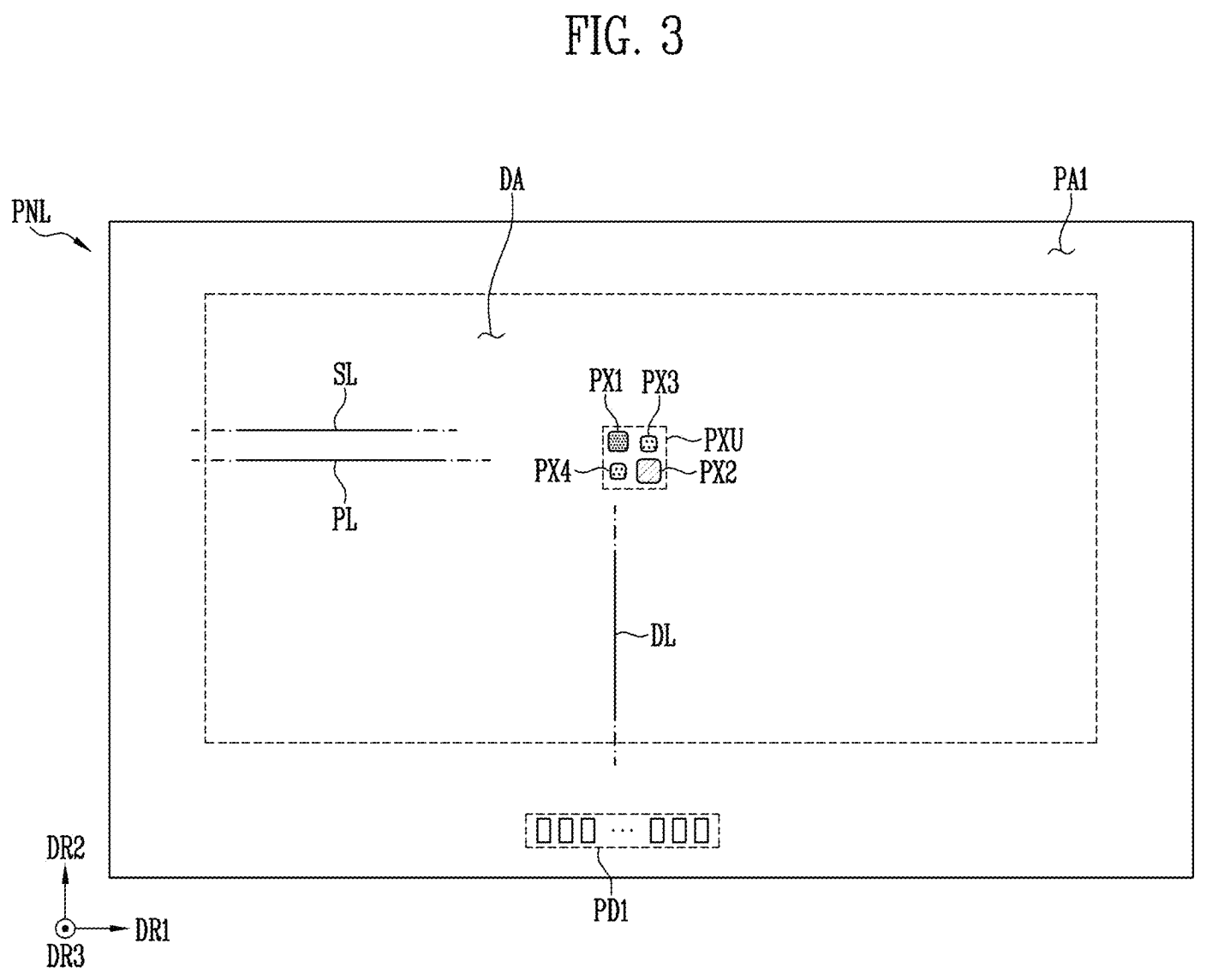

FIG. 3 is a plan view illustrating the panel layer of FIG. 2.

Referring to FIG. 3, a unit pixel PXU and interconnects may be disposed in the display area DA of the panel layer PNL. A first pad array PD1 may be disposed in the first peripheral area PA1 of the panel layer PNL.

The unit pixel PXU may include pixels disposed according to certain rules. A plurality of unit pixels PXU may be provided in the display area DA. In this case, the unit pixels PXU may fill the display area DA without substantially any blank space.

In one embodiment, the unit pixel PXU may include first to fourth pixels PX1, PX2, PX3, and PX4. First to third pixels PX1, PX2, PX3, and PX4 may be disposed to correspond to four vertices of a virtual quadrilateral. Each of the third and fourth pixels PX3 and PX4 may have a relatively small planar area and may emit light of a first color. The second pixel PX2 may have a relatively large planar area and may emit light of a second color. The first pixel PX1 may emit light of a third color. However, the description of the pixels included in the unit pixel PXU described above is illustrative, and the unit pixel PXU may include two or more pixels having various shapes, areas, and arrangements in a plan view.

In one embodiment, the plurality of interconnects disposed in the display area DA may include a scan line SL, a data line DL, and a power line PL.

The scan line SL may extend from the display area DA in the first direction DR1. The scan line SL may also extend in a direction opposite to the first direction DR1, and accordingly, the scan line SL may extend to the first peripheral area PA1. In this case, the scan line SL may be electrically connected to a driving circuit (for example, a gate driving circuit) disposed in the first peripheral area PA1.

The data line DL may extend from the display area DA in the second direction DR2. The data line DL may also extend in a direction opposite to the second direction DR2, and accordingly, the data line DL may extend to the first peripheral area PA1. In this case, the data line DL may be electrically connected to a driving circuit (for example, an integrated circuit (IC) chip or a data driving circuit) disposed in the first peripheral area PA1.

The power line PL may extend from the display area DA in the first direction DR1. The power line PL may also extend in a direction opposite to the first direction DR1, and accordingly, the power line PL may extend to the first peripheral area PA1. In this case, the power line PL may be electrically connected to a driving circuit (for example, a power supply circuit) disposed in the first peripheral area PA1.

In FIG. 3, for convenience of description, only one scan line SL, one power line PL, and one data line DL are shown. However, a plurality of scan lines SL, a plurality of power lines PL, and a plurality of data lines DL may be provided. In this case, the scan lines SL may be arranged in the second direction DR2 in the display area DA, the data lines DL may be arranged in the first direction DR1 in the display area DA, and the power lines PL may be arranged in the second direction DR2 in the display area DA. According to embodiments of the present disclosure, the power lines PL in the display area DA may have a mesh structure including first power lines extending in the first direction DR1 and second power lines electrically connected to the first power lines and extending in the second direction DR2.

The first pad array PD1 may include pads. The pads may be electrically connected to at least one of the driving circuits (for example, the gate driving circuit, the IC chip, the data driving circuit, and the power supply circuit). In addition, the pads may be electrically connected to an electronic device (for example, an IC) that supplies various electrical signals.

In one embodiment, the panel layer PNL may be bent in the first peripheral area PA1. In this case, the first pad array PD1 may be positioned on a rear surface of the panel layer PNL.

Figure 4:
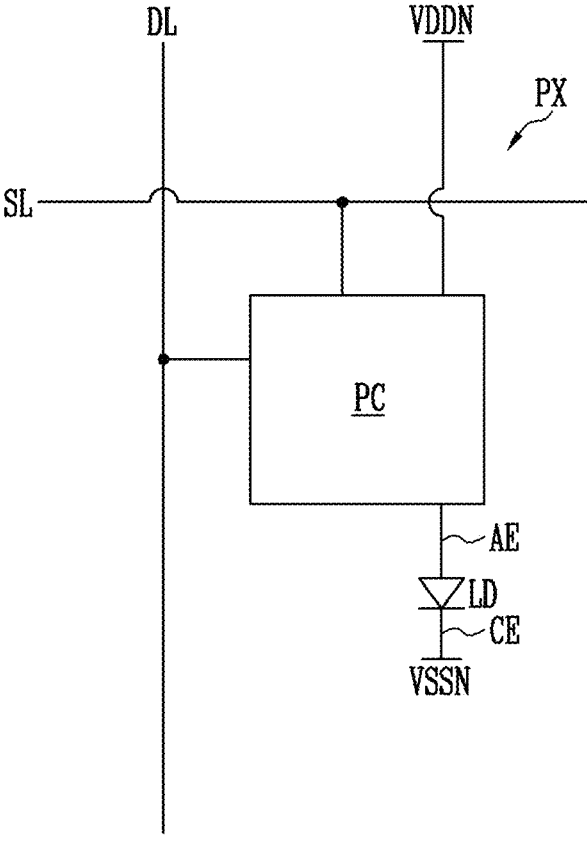
FIG. 4 is a schematic diagram and FIG. 5 is a cross-sectional view illustrating a pixel included in the panel layer of FIG. 3.
Figure 5:
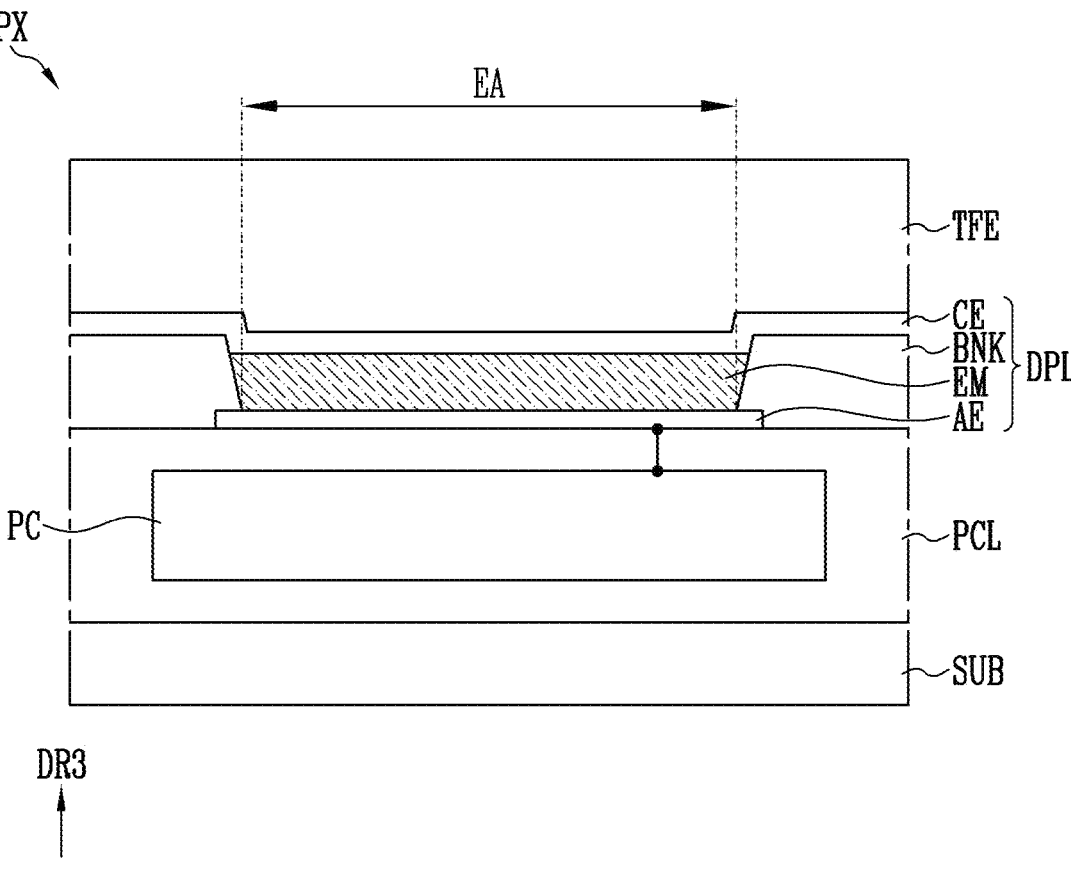

FIGS. 4 and 5 are views illustrating the pixel included in the panel layer of FIG. 3.

Referring to FIG. 4, the pixel PX may include a pixel circuit PC and a light-emitting element LD. Here, the pixel PX may be any one of the first to fourth pixels PX1, PX2, PX3, and PX4 of FIG. 3.

The light-emitting element LD may be connected between a first power voltage node VDDN and a second power voltage node VSSN. The first power voltage node VDDN may be connected to one of the power lines PL of FIG. 3 to receive a first power voltage. The second power voltage node VSSN may be connected to a second power voltage supply positioned in the first peripheral area PA1 of FIG. 3 to receive a second power voltage. In one embodiment, the first power voltage may have a higher voltage level than the second power voltage.

The light-emitting element LD may be connected between an anode AE and a cathode CE. The anode AE may be connected to the first power voltage node VDDN through the pixel circuit PC. For example, the anode AE may be connected to the first power voltage node VDDN through one or more transistors included in the pixel circuit PC. The cathode CE may be connected to the second power voltage node VSSN. The light-emitting element LD may be configured to emit light according to a current flowing from the anode AE to the cathode CE.

The pixel circuit PC may be connected to the scan line SL and data line DL of FIG. 3. In response to a scan signal received through the scan line SL, the pixel circuit PC may control the light-emitting element LD to emit light according to a data signal received through the data line DL.

For such operations, the pixel circuit PC may include circuit elements such as transistors and one or more capacitors.

The transistors of the pixel circuit PC may include P-type transistors and/or N-type transistors. In embodiments, the transistors of the pixel circuit PC may include a metal oxide silicon filed effect transistor (MOSFET). In embodiments, the transistors of the pixel circuit PC may include an amorphous silicon semiconductor, a monocrystalline silicon semiconductor, a polycrystalline silicon semiconductor, an oxide semiconductor, or the like.

Referring to FIG. 5, the pixel PX is shown when the display device DD is an organic light-emitting diode (OLED) display device. Here, the pixel PX may be any one of the first to fourth pixels PX1, PX2, PX3, and PX4 of FIG. 3.

The pixel PX may be implemented by a substrate SUB, a circuit layer PCL, a display layer DPL, and an encapsulation layer TFE.

One or more transistors, one or more capacitors, and various types of interconnects included in the circuit layer PCL may constitute the pixel circuit PC.

The display layer DPL may include an anode AE, a bank layer BNK, an organic emission layer EM, and a cathode CE.

The anode AE may be disposed on the circuit layer PCL. The anode AE may be connected to the pixel circuit PC through a through-hole passing through one or more insulating layers of various insulating layers constituting the circuit layer PCL.

The bank layer BNK may be disposed on the anode AE and the circuit layer PCL. A pixel opening exposing a portion of the anode AE may be defined in the bank layer BNK. The bank layer BNK may include a light blocking material and may serve to prevent light mixing between adjacent pixels. For example, the bank layer BNK may include an organic material. For example, the bank layer BNK may include an acryl resin, an epoxy resin, a phenol resin, a polyamide resin, and/or a polyimide resin.

The organic emission layer EM may be disposed on the anode AE in the pixel opening defined in the bank layer BNK. The organic emission layer EM may include an organic emission material. The organic emission layer EM may be provided as the light-emitting element LD (see FIG. 4) of the pixel PX.

The cathode CE may be disposed on the organic emission layer EM and the bank layer BNK. The cathode CE may be substantially transparent or semi-transparent to satisfy pre-determined light transmittance. For example, the cathode CE may include indium tin oxide, indium zinc oxide, zinc oxide, indium gallium zinc oxide, and/or indium tin zinc oxide.

The encapsulation layer TFE may be disposed on the cathode CE. In one embodiment, the encapsulation layer TFE may include a first inorganic encapsulation layer, an organic encapsulation layer, and a second inorganic encapsulation layer which are sequentially stacked in the third direction DR3.

In embodiments, an emission area EA of the pixel PX may be defined. The emission area EA may be an area of the pixel PX which substantially emits light. For example, the emission area EA may be defined as an area corresponding to an exposed surface of the anode AE exposed by the pixel opening defined in the bank layer BNK.

In FIG. 5, a case in which the display device DD is the organic light-emitting display device has been described, but the present invention is not necessarily limited thereto. The display device DD may include various types of light sources known in the art, such as a liquid crystal display device and a micro light-emitting diode (LED) display device. In this case, the pixel PX may have various known structures implemented by the above-described light sources without limitation.

Figure 6:
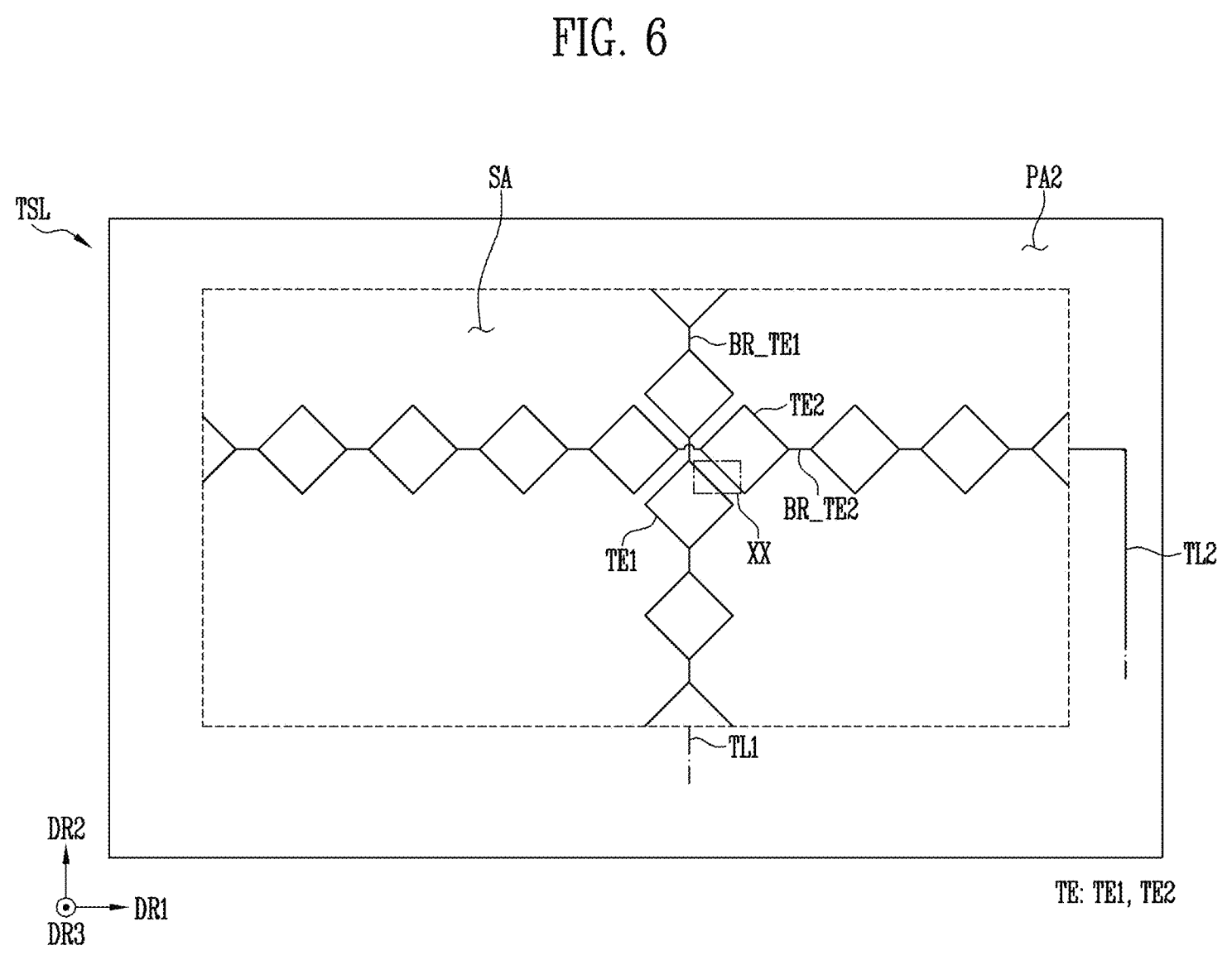

FIG. 6 is a plan view illustrating the input sensing layer of FIG. 2.

Referring to FIG. 6, the sensing electrode TE may be disposed in the sensing area SA of the input sensing layer TSL. The sensing electrode TE may include a first sensing electrode TE1 and a second sensing electrode TE2.

A plurality of first sensing electrodes TE1 may be provided in the sensing area SA, and the first sensing electrodes TE1 may be arranged in the second direction DR2. Two adjacent sensing electrodes TE1 may be electrically connected to each other by a first connection pattern BR_TE1. A plurality of first connection patterns BR_TE1 may be provided in the sensing area SA. The first sensing electrodes TE1 arranged in the second direction DR2 and the first connection patterns BR_TE1 electrically connecting the first sensing electrodes TE1 may define a sensing column.

A plurality of second sensing electrodes TE2 may be provided in the sensing area SA, and the second sensing electrodes TE2 may be arranged in the first direction DR1. Two adjacent second sensing electrodes TE2 may be electrically connected to each other by a second connection pattern BR_TE2. A plurality of second connection patterns BR_TE2 may be provided in the sensing area SA. The second sensing electrodes TE2 arranged in the first direction DR1 and the second connection patterns BR_TE2 electrically connecting the second sensing electrodes TE2 may define a sensing row.

A plurality of sensing columns may be provided in the sensing area SA. In this case, the sensing columns may be arranged in the first direction DR1. A plurality of sensing rows may be provided in the sensing area SA. In this case, the sensing rows may be arranged in the second direction DR2.

The first sensing electrodes TE1 constituting the sensing columns and the second sensing electrodes TE2 constituting the sensing rows may be implemented using any one conductive layer of the first and second sensing conductive layers TCL1 and TCL2 described with reference to FIG. 2. For example, the first sensing electrodes TE1 and the second sensing electrodes TE2 may consist of various types of patterns (or electrodes) formed of the first sensing conductive layer TCL1. Hereinafter, for convenience of description, it is assumed that the first sensing electrodes TE1 and the second sensing electrodes TE2 are formed of the first sensing conductive layer TCL1.

The first connection patterns BR_TE1 constituting the sensing columns and the second connection patterns BR_TE2 constituting the sensing rows may be insulated from and intersected with each other. For example, the first connection patterns BR_TE1 may be formed of the first sensing conductive layer TCL1 described with reference to FIG. 2, and the second connection patterns BR_TE2 may be formed of the second sensing conductive layer TCL2. In this case, the first connection patterns BR_TE1 may be formed integrally with the first sensing electrodes TE1, and the second connection patterns BR_TE2 may be in electrical contact with the second sensing electrodes TE2 through through-holes passing through the second insulating layer TIL2 described with reference to FIG. 2.

In embodiments, the sensing columns may be electrically insulated from the sensing rows. For example, the first sensing electrodes TE1 and the second sensing electrodes TE2 may be disposed so as not to overlap each other in a plan view, and at least one insulating layer (for example, TIL2 in FIG. 2) may be interposed between the first connection patterns BR_TE1 and the second connection patterns BR_TE2.

The sensing columns and the sensing rows may detect a touch input of a user of the display device DD and a position thereof. For example, when a touch input of a user is performed at a specific position, the mutual capacitance between the sensing columns and the sensing rows at the position may change (for example, may decrease). Such a change in mutual capacitance may be transmitted to a touch processor disposed in the second peripheral area PA2 or the first peripheral area PA1 (see FIG. 3) through a first transmission interconnect TL1 connected to the sensing column and a second transmission interconnect TL2 connected to the sensing row. Accordingly, the touch processor may detect a touch input of a user of the display device DD and a position thereof.

Figure 7:
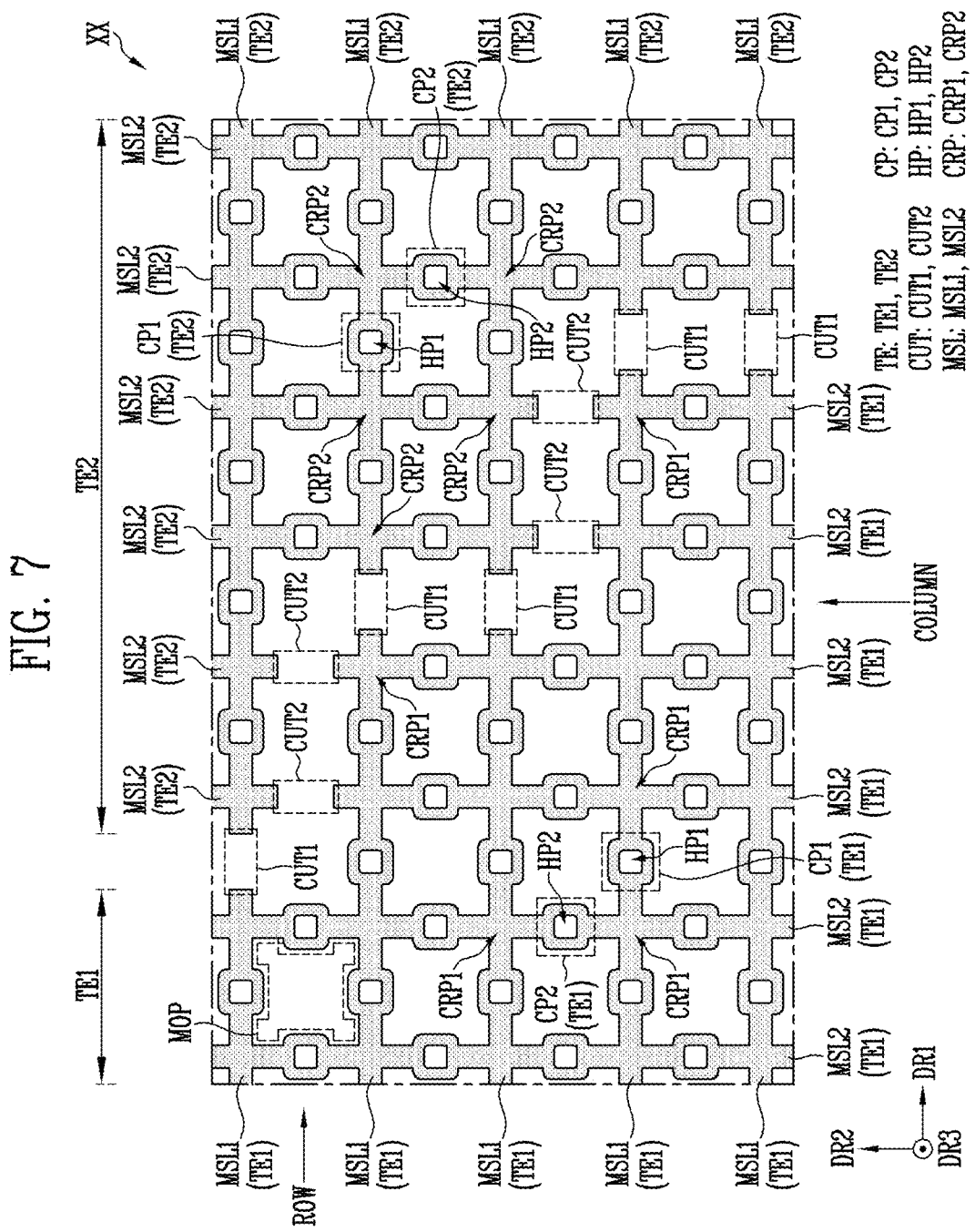
FIG. 7 is a plan view illustrating first and second sensing electrodes included in the input sensing layer of FIG. 6.

FIG. 7 is a plan view illustrating the first and second sensing electrodes included in the input sensing layer of FIG. 6. FIG. 7 is an enlarged plan view of area XX in FIG. 6.

Referring to FIG. 7, the sensing electrode TE may be implemented with mesh lines MSL. The mesh lines MSL may include first mesh lines MSL1 extending in the first direction DR1 and second mesh lines MSL2 extending in the second direction DR2. The first mesh lines MSL1 may be arranged in the second direction DR2, and the second mesh lines MSL2 may be arranged in the first direction DR1. As described above, when it is assumed that the sensing electrode TE is implemented with the first sensing conductive layer TCL1, the mesh lines MSL may also be implemented with the first sensing conductive layer TCL1.

Mesh openings MOP may be defined by the first and second mesh lines MSL1 and MSL2 that intersect each other. The mesh openings MOP may be surrounded by the first and second mesh lines MSL1 and MSL2. The mesh openings MOP may overlap the first to fourth pixels PX1, PX2, PX3, and PX4 described with reference to FIG. 3 in a plan view. For example, the mesh lines MSL might not overlap the first to fourth pixels PX1, PX2, PX3, and PX4 in a plan view. Accordingly, light emitted from the first to fourth pixels PX1, PX2, PX3, and PX4 might not be substantially blocked by the mesh lines MSL. More details will be described below with reference to FIG. 20.

The first and second mesh lines MSL1 and MSL2 may intersect each other at intersection points CRP. The intersection points CRP may include first intersection points CRP1 and second intersection points CRP2. The first intersection points CRP1 may be points at which the first and second mesh lines MSL1 and MSL2 constituting a first sensing electrode TE1 intersect each other. The second intersection points CRP2 may be points at which the first and second mesh lines MSL1 and MSL2 constituting a second sensing electrode TE2 intersect each other.

In each of some of the mesh lines MSL, a cut point CUT may be defined between two adjacent intersection points among the intersection points CRP. For example, in each of the first mesh lines MSL1, a first cut point CUT1 may be defined between the first intersection point CRP1 and the second intersection point CRP2 that are adjacent to each other. In each of the second mesh lines MSL2, a second cut point CUT2 may be defined between the first intersection point CRP1 and the second intersection points CRP2 that are adjacent to each other. A plurality of first cut points CUT1 and a plurality of second cut points CUT2 may be provided. In this case, the mesh lines MSL are separated from each other by the first cut points CUT1 and the second cut points CUT2 to provide the first and second sensing electrodes TE1 and TE2 that are spaced apart from each other. For example, the first cut points CUT1 and the second cut points CUT2 may be provided in areas between the first sensing electrode TE1 and the second sensing electrode TE2, thereby providing the first sensing electrode TE1 and the second sensing electrode TE2 separated from each other.

In a mesh line for which the cut point CUT is not defined between two adjacent intersection points among the mesh lines MSL, a compensation pattern CP protruding from side surfaces of the mesh line may be defined. The compensation pattern CP may include a through-hole pattern HP positioned at a central portion of the compensation pattern CP.

For example, the first cut point CUT1 may be defined between the first intersection point CRP1 and the second intersection point CRP2 adjacent to each other in each of the first mesh lines MSL1. In this case, a first compensation pattern CP1 including a first through-hole pattern HP1 may be defined between adjacent first intersection points CRP1 in each of the first mesh lines MSL1 constituting the first sensing electrode TE1. A first compensation pattern CP1 including a first through-hole pattern HP1 may be defined between the second intersection points CRP2 adjacent to each other in each of the first mesh lines MSL1 constituting the second sensing electrode TE2. The first through-hole pattern HP1 may be positioned at a central portion of the first compensation pattern CP1.

Likewise, a second cut point CUT2 may be defined between the first intersection point CRP1 and the second intersection point CRP2 adjacent to each other in each of the second mesh lines MSL2. In this case, a second compensation pattern CP2 including a second through-hole pattern HP2 may be defined between the first intersection points CRP1 adjacent to each other in each of the second mesh lines MSL2 constituting the first sensing electrode TE1. A second compensation pattern CP2 including a second through-hole pattern HP2 may be defined between the second intersection points CRP2 adjacent to each other in each of the second mesh lines MSL2 constituting the second sensing electrode TE2. The second through-hole pattern HP2 may be positioned at a central portion of the second compensation pattern CP2.

In this case, as shown in FIG. 7, a plurality of first compensation patterns CP1 and a plurality of second compensation patterns CP2 be provided in the mesh lines MSL.

In one embodiment, the first cut points CUT1 and the first compensation patterns CP1 may be arranged in a line in the mesh lines MSL in the second direction DR2. For example, in an example column COLUMN of FIG. 7, the first cut points CUT1 and the first compensation patterns CP1 may be arranged in a line in the second direction DR2.

In one embodiment, the second cut points CUT2 and the second compensation patterns CP2 may be arranged in a line in the mesh lines MSL in the first direction DR1. For example, in an example row ROW of FIG. 7, the second cut points CUT2 and the second compensation patterns CP2 may be arranged in a line in the first direction DR1.

Hereinafter, the cut point CUT, the compensation pattern CP, and the through-hole pattern HP of FIG. 7 will be described in more detail with reference to FIGS. 8 to 15.

Figure 8:
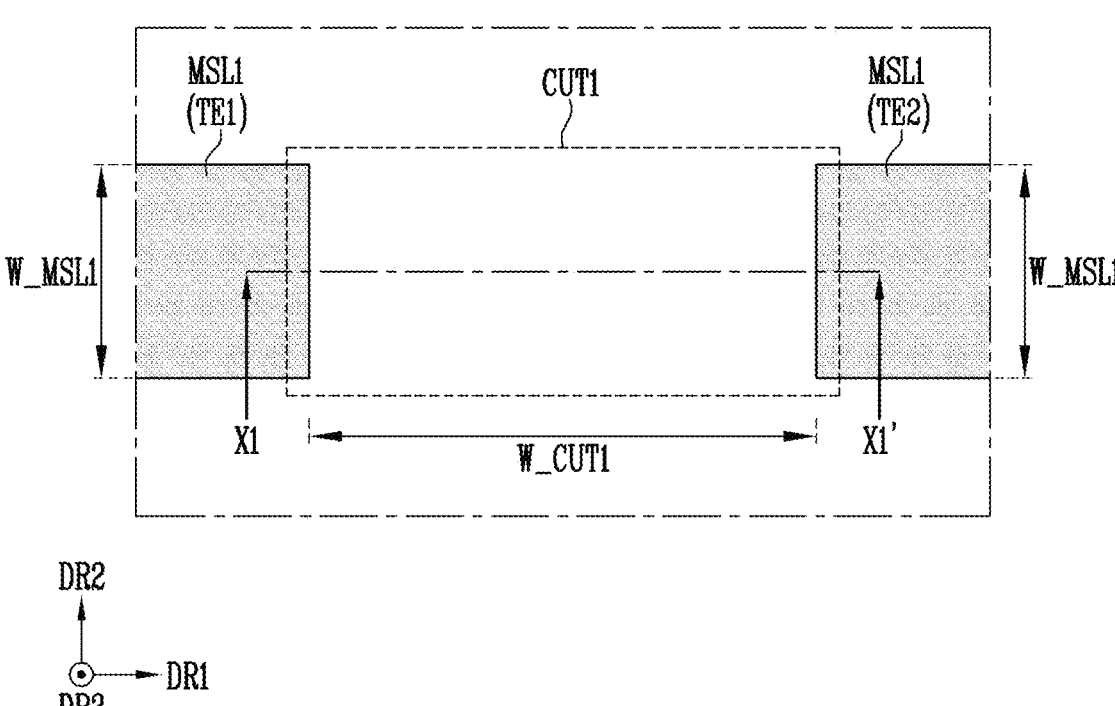
FIG. 8 is a plan view illustrating a first cut point of FIG. 7.
Figure 9:
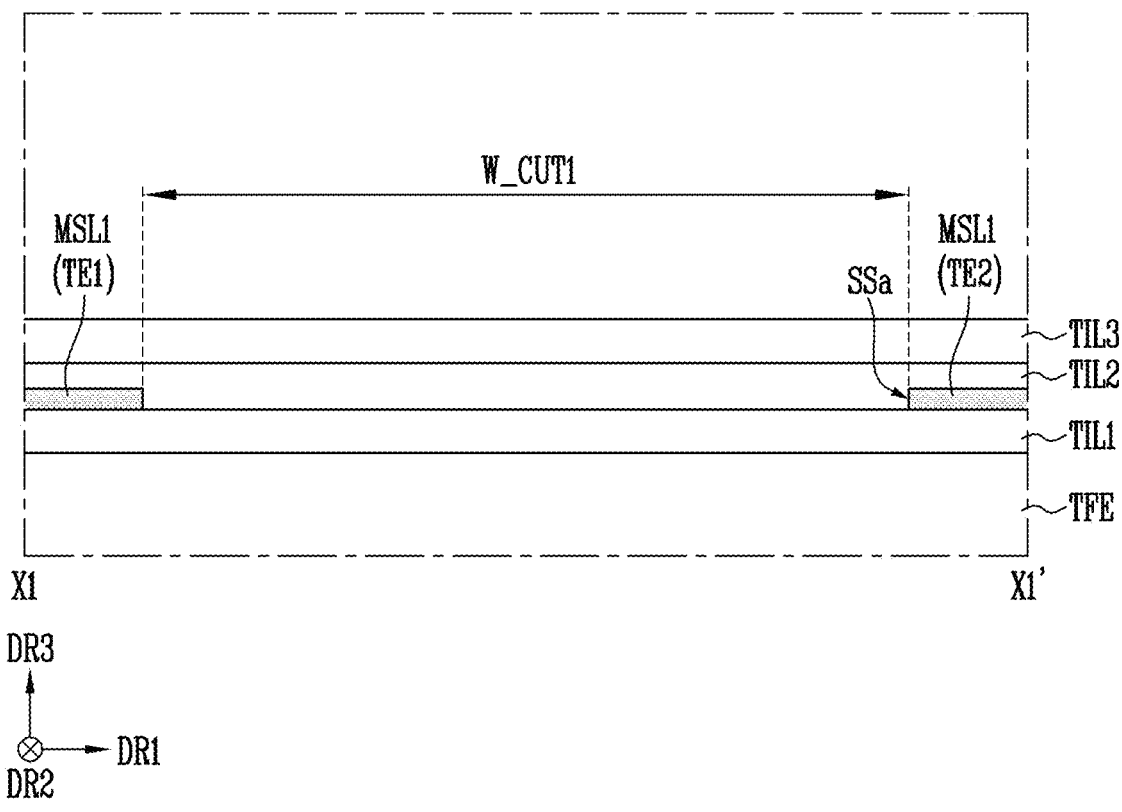
FIG. 9 is a cross-sectional view taken along line X1-X1' of FIG. 8.

FIG. 8 is a plan view illustrating the first cut point of FIG. 7. FIG. 9 is a cross-sectional view taken along line X1-X1' of FIG. 8.

Referring to FIGS. 8 and 9, the first mesh line MSL1 may be interposed between the first insulating layer TIL1 and the second insulating layer TIL2. For example, the first mesh line MSL1 may be implemented with the first sensing conductive layer TCL1 (see FIG. 2).

The first cut point CUT1 may be defined between the first mesh line MSL1 constituting the first sensing electrode TE1 and the first mesh line MSL1 constituting the second sensing electrode TE2. In this case, the first mesh line MSL1 constituting the first sensing electrode TE1 and the first mesh line MSL1 constituting the second sensing electrode TE2 may be separated from each other by the first cut point CUT1.

The first mesh line MSL1 constituting the first sensing electrode TE1 and the first mesh line MSL1 constituting the second sensing electrode TE2 may each have a width W_MSL1 in the second direction DR2. The first cut point CUT1 may have a width W_CUT1 in the first direction DR1. The width W_CUT1 of the first cut point CUT1 is a separation distance between the first mesh line MSL1 constituting the first sensing electrode TE1 and the first mesh line MSL1 constituting the second sensing electrode TE2. In one embodiment, the width W_CUT1 of the first cut point CUT1 may be greater than the width W_MSL1 of the first mesh line MSL1.

Figure 10:
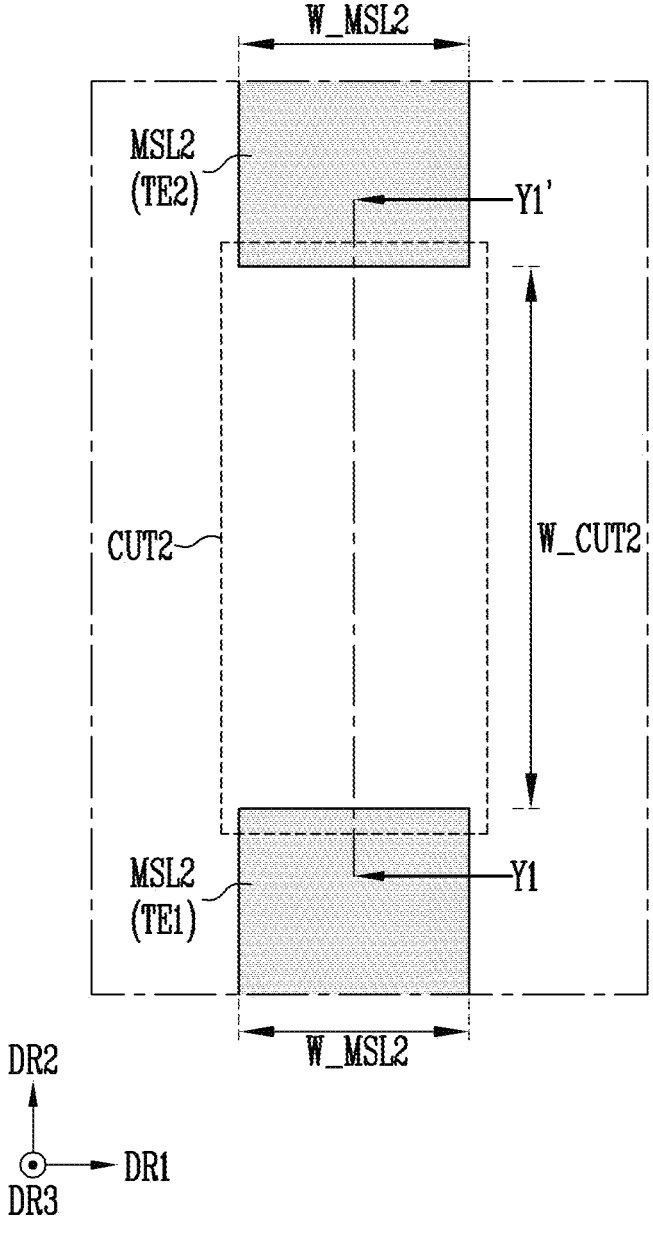
FIG. 10 is a plan view illustrating a second cut point of FIG. 7.
Figure 11:
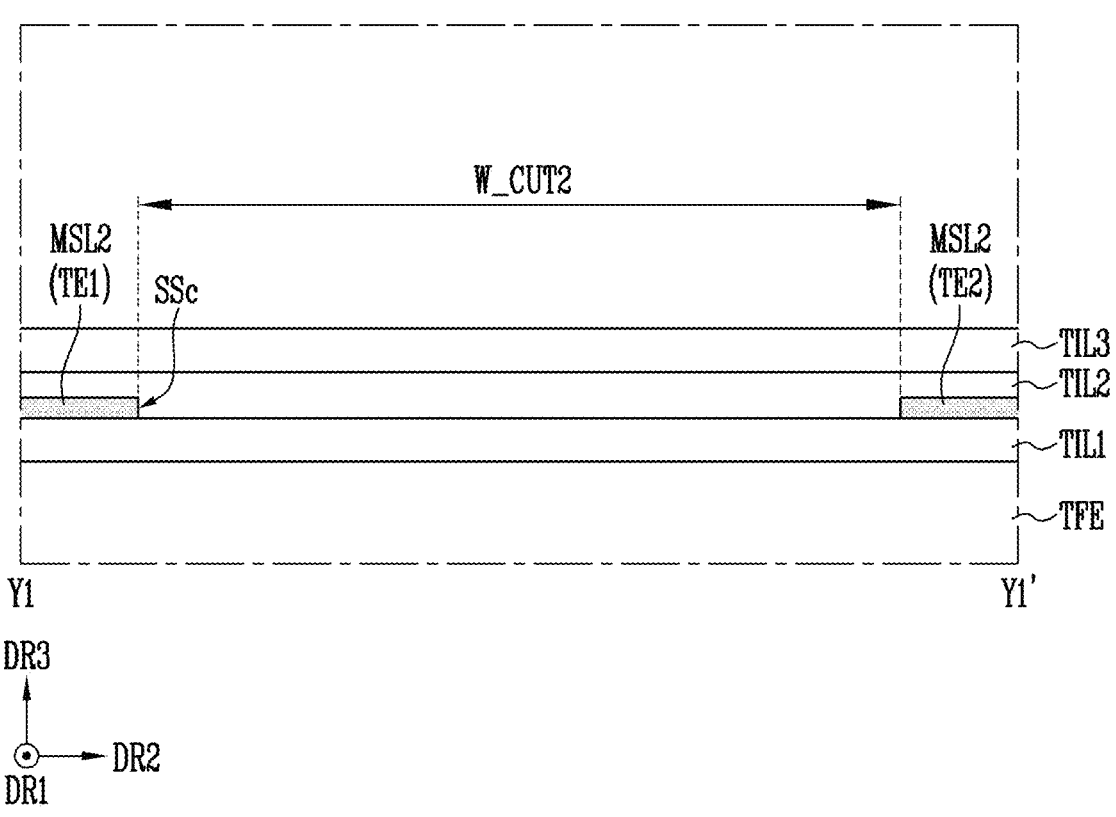
FIG. 11 is a cross-sectional view taken along line Y1-Y1' of FIG. 10.

FIG. 10 is a plan view illustrating the second cut point of FIG. 7. FIG. 11 is a cross-sectional view taken along line Y1-Y1' of FIG. 10.

Referring to FIGS. 10 and 11, the second mesh line MSL2 may be interposed between the first insulating layer TIL1 and the second insulating layer TIL2. For example, the second mesh line MSL2 may be implemented with the first sensing conductive layer TCL1 (see FIG. 2).

The second cut point CUT2 may be defined between the second mesh line MSL2 constituting the first sensing electrode TE1 and the second mesh line MSL2 constituting the second sensing electrode TE2. In this case, the second mesh line MSL2 constituting the first sensing electrode TE1 and the second mesh line MSL2 constituting the second sensing electrode TE2 may be separated from each other by the second cut point CUT2.

The second mesh line MSL2 constituting the first sensing electrode TE1 and the second mesh line MSL2 constituting the second sensing electrode TE2 may each have a width W_MSL2 in the first direction DR1. The second cut point CUT2 may have a width W_CUT2 in the second direction DR2. The width W_CUT2 of the second cut point CUT2 may be a separation distance between the second mesh line MSL2 constituting the first sensing electrode TE1 and the second mesh line MSL2 constituting the second sensing electrode TE2. In one embodiment, the width W_CUT2 of the second cut point CUT2 may be greater than the width W_MSL2 of the second mesh line MSL2.

Referring again to FIGS. 8 to 11, in one embodiment, the width W_MSL1 of the first mesh line MSL1 may be substantially equal to the width W_MSL2 of the second mesh line MSL2. For example, the width W_MSL1 of the first mesh line MSL1 may be in a range of about 95% to about 105% of the width W_MSL2 of the second mesh line MSL2.

In one embodiment, the width W_CUT1 of the first cut point CUT1 may be substantially equal to the width W_CUT2 of the second cut point CUT2. For example, the width W_CUT1 of the first cut point CUT1 may be in a range of about 95% to about 105% of the width W_CUT2 of the second cut point CUT2.

Figure 12:
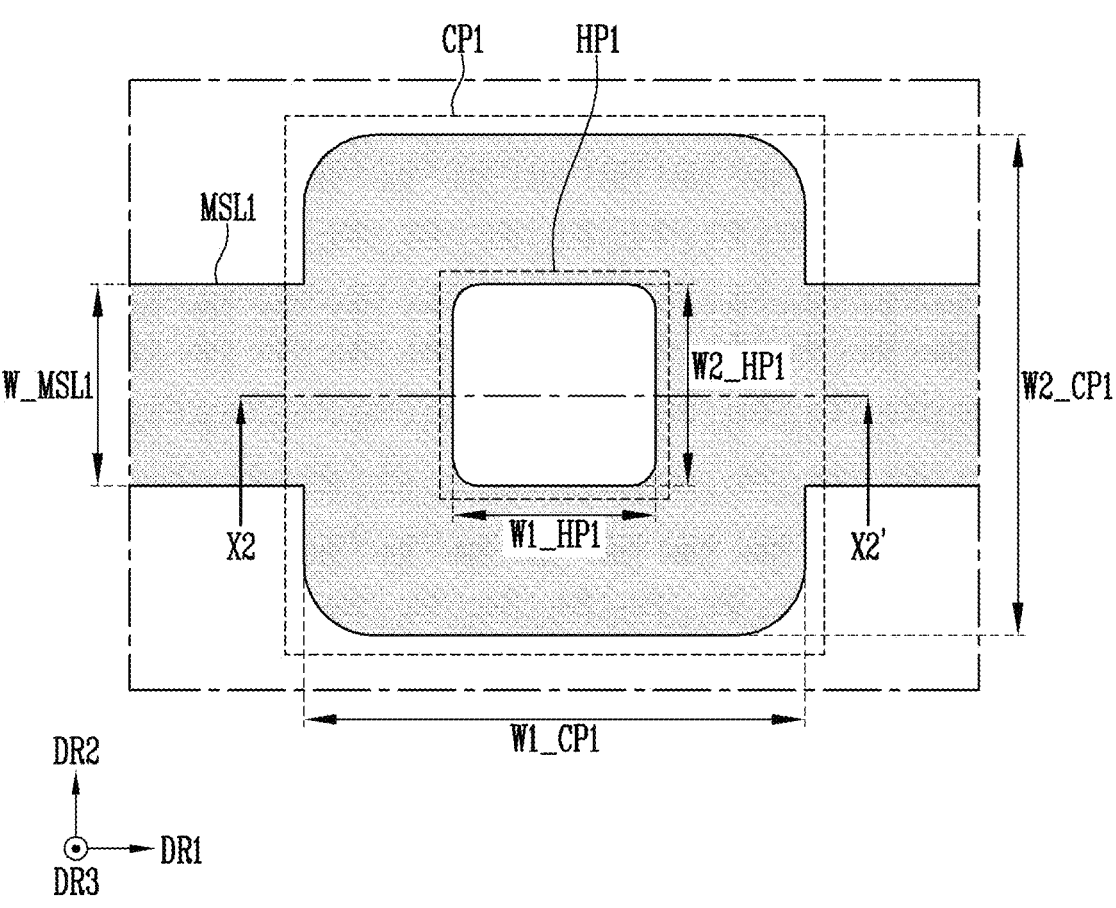
FIG. 12 is a plan view illustrating a first compensation pattern of FIG. 7.
Figure 13:
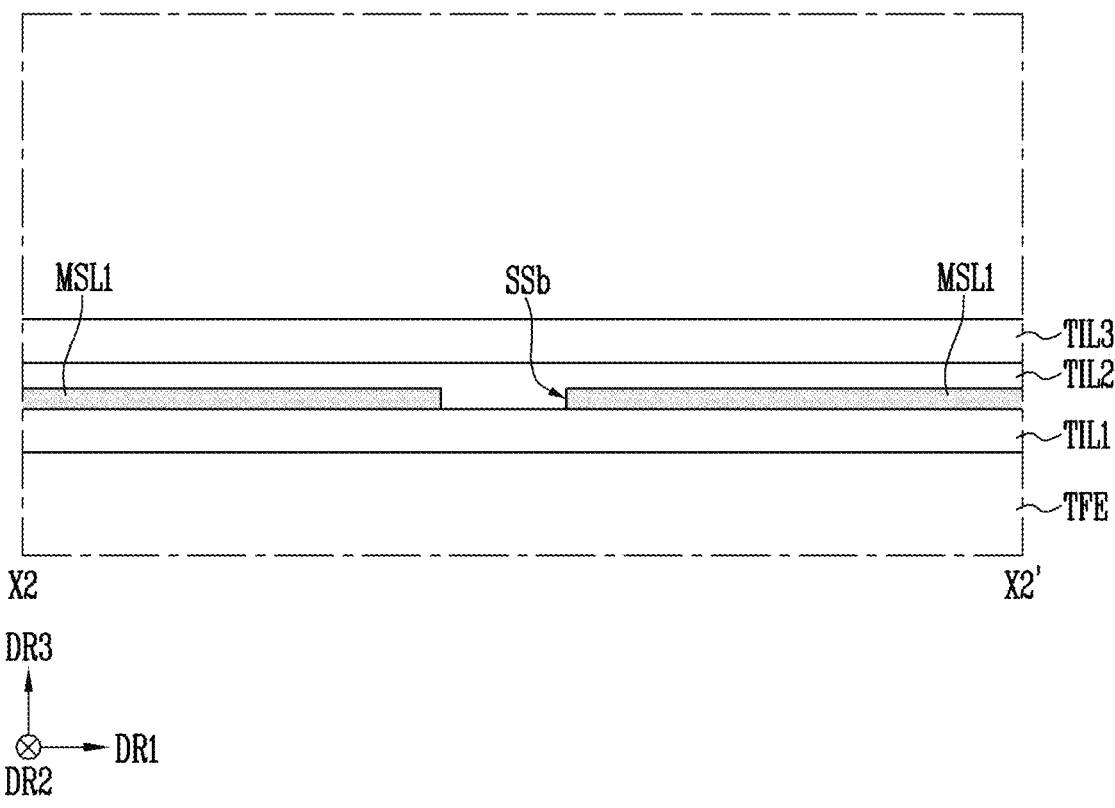
FIG. 13 is a cross-sectional view taken along line X2-X2' of FIG. 12.

FIG. 12 is a plan view illustrating the first compensation pattern of FIG. 7. FIG. 13 is a cross-sectional view taken along line X2-X2' of FIG. 12.

Referring to FIGS. 12 and 13, the first compensation pattern CP1 may be defined in the first mesh line MSL1. The first compensation pattern CP1 may have a planar shape that protrudes from side surfaces of the first mesh line MSL1 in the second direction DR2 and in a direction opposite to the second direction DR2. In one embodiment, the first compensation pattern CP1 may have a quadrilateral shape with rounded corners in a plan view. However, the planar shape of the first compensation pattern CP1 is not necessarily limited thereto. The first compensation pattern CP1 may have various shapes without limitation. For example, the first compensation pattern CP1 may have a circular shape, a polygonal shape, or a polygonal shape with rounded corners.

In one embodiment, the maximum width W1_CP1 of the first compensation pattern CP1 in the first direction DR1 may be substantially equal to the width W_CUT1 (see FIG. 8) of the first cut point CUT1. For example, the maximum width W1_CP1 of the first compensation pattern CP1 in the first direction DR1 may be in a range of about 95% to about 105% of the width W_CUT1 of the first cut point CUT1.

In one embodiment, the maximum width W2_CP1 of the first compensation pattern CP1 in the second direction DR2 may be substantially equal to the width W_CUT2 (see FIG. 10) of the second cut point CUT2. For example, the maximum width W2_CP1 of the first compensation pattern CP1 in the second direction DR2 may be in a range of about 95% to about 105% of the width W_CUT2 of the second cut point CUT2.

The first compensation pattern CP1 may include the first through-hole pattern HP1. The first through-hole pattern HP1 may be positioned at the central portion of the first compensation pattern CP1. For example, the first through-hole pattern HP1 may be surrounded by the first compensation pattern CP1 to have a closed curve shape in a plan view. The first through-hole pattern HP1 may be a pattern corresponding to a through-hole passing through the first mesh line MSL1, in which the first compensation pattern CP1 is defined, in the third direction DR3. For example, in an area in which the first through-hole pattern HP1 is defined, the first insulating layer TIL1 and the second insulating layer TIL2 may be in direct contact with each other.

In one embodiment, the first through-hole pattern HP1 may have a quadrilateral shape with rounded corners in a plan view. However, the planar shape of the first through-hole pattern HP1 is not necessarily limited thereto. The first through-hole pattern HP1 may have various shapes without limitation. For example, the first through-hole pattern HP1 may have a circular shape, a polygonal shape, or a polygonal shape with rounded corners.

In one embodiment, the maximum width W1_HP1 of the first through-hole pattern HP1 in the first direction DR1 may be about 80% or more of the width W_MSL2 (see FIG. 10) of the second mesh line MSL2. For example, the maximum width W1_HP1 of the first through-hole pattern HP1 in the first direction DR1 may be in a range of about 95% to about 105% of the width W_MSL2 of the second mesh line MSL2. For example, the maximum width W1_HP1 of the first through-hole pattern HP1 in the first direction DR1 may be equal to the width W_MSL2 of the second mesh line MSL2.

In one embodiment, the maximum width W2_HP1 of the first through-hole pattern HP1 in the second direction DR2 may be about 80% or more of the width W_MSL1 (see FIG. 8) of the first mesh line MSL1. For example, the maximum width W2_HP1 of the first through-hole pattern HP1 in the second direction DR2 may be in a range of about 95% to about 105% of the width W_MSL1 of the first mesh line MSL1. For example, the maximum width W2_HP1 of the first through-hole pattern HP1 in the second direction DR2 may be equal to the width W_MSL1 of the first mesh line MSL1.

Figure 14:
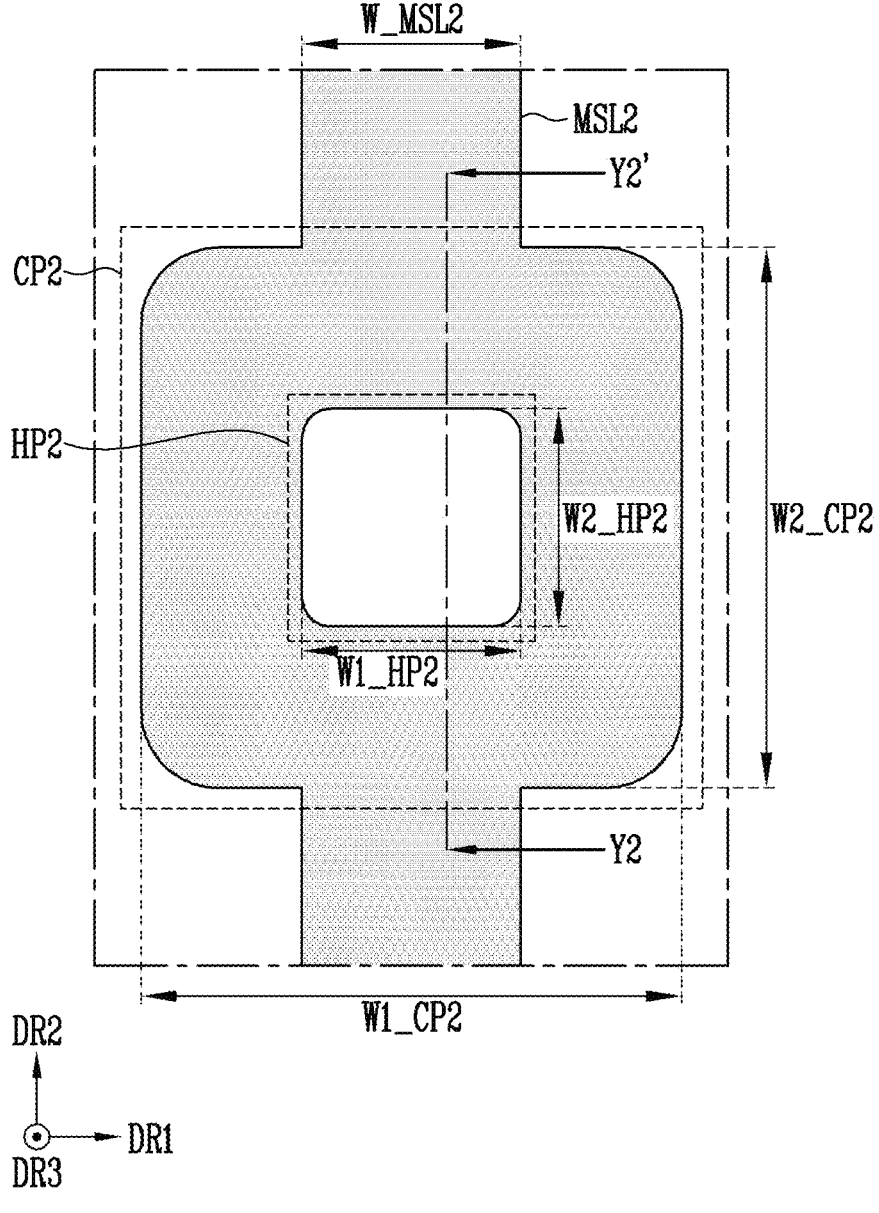
FIG. 14 is a plan view illustrating a second compensation pattern of FIG. 7.
Figure 15:
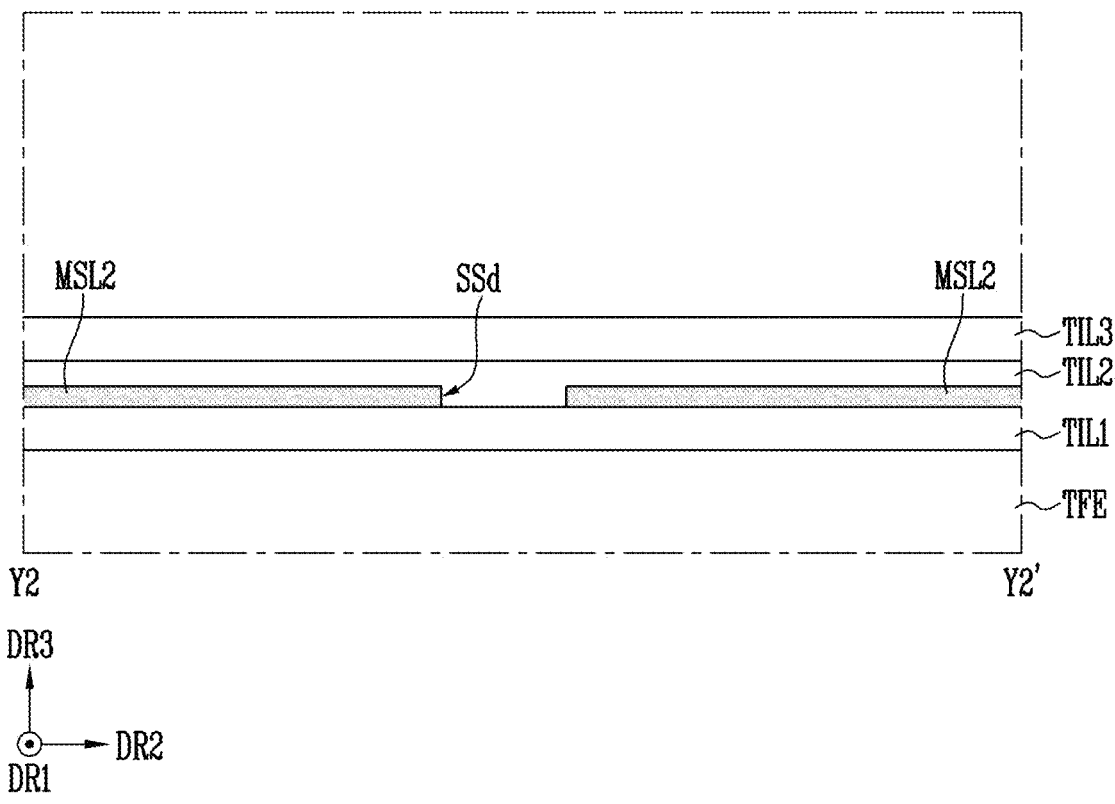
FIG. 15 is a cross-sectional view taken along line Y2-Y2' of FIG. 14.

FIG. 14 is a plan view illustrating the second compensation pattern of FIG. 7. FIG. 15 is a cross-sectional view taken along line Y2-Y2' of FIG. 14.

Referring to FIGS. 14 and 15, the second compensation pattern CP2 may be defined in the second mesh line MSL2. The second compensation pattern CP2 may have a planar shape that protrudes from side surfaces of the second mesh line MSL2 in the first direction DR1 and in a direction opposite to the first direction DR1. In one embodiment, the second compensation pattern CP2 may have a quadrilateral shape with rounded corners in a plan view. However, the planar shape of the second compensation pattern CP2 is not necessarily limited thereto. The second compensation pattern CP2 may have various shapes without limitation. For example, the second compensation pattern CP2 may have a circular shape, a polygonal shape, or a polygonal shape with rounded corners.

In one embodiment, the maximum width W1_CP2 of the second compensation pattern CP2 in the first direction DR1 may be substantially equal to the width W_CUT1 (see FIG. 8) of the first cut point CUT1. For example, the maximum width W1_CP2 of the second compensation pattern CP2 in the first direction DR1 may be in a range of about 95% to about 105% of the width W_CUT1 of the first cut point CUT1.

In one embodiment, the maximum width W2_CP2 of the second compensation pattern CP2 in the second direction DR2 may be substantially equal to the width W_CUT2 (see FIG. 10) of the second cut point CUT2. For example, the maximum width W2_CP2 of the second compensation pattern CP2 in the second direction DR2 may be in a range of about 95% to about 105% of the width W_CUT2 of the second cut point CUT2.

The second compensation pattern CP2 may include the second through-hole pattern HP2. The second through-hole pattern HP2 may be positioned at the central portion of the second compensation pattern CP2. For example, the second through-hole pattern HP2 may be surrounded by the second compensation pattern CP2 to have a closed curve shape in a plan view. The second through-hole pattern HP2 may be a pattern corresponding to a through-hole passing through the second mesh line MSL2, in which the second compensation pattern CP2 is defined, in the third direction DR3. Illustrating, in an area in which the second through-hole pattern HP2 is defined, the first insulating layer TIL1 and the second insulating layer TIL2 may be in direct contact with each other.

In one embodiment, the second through-hole pattern HP2 may have a quadrilateral shape with rounded corners in a plan view. However, the planar shape of the second through-hole pattern HP2 is not necessarily limited thereto. The second through-hole pattern HP2 may have various shapes without limitation. For example, the second through-hole pattern HP2 may have a circular shape, a polygonal, or a polygonal shape with rounded corners.

In one embodiment, the maximum width W1_HP2 of the second through-hole pattern HP2 in the first direction DR1 may be about 80% or more of the width W_MSL2 (see FIG. 10) of the second mesh line MSL2. For example, the maximum width W1_HP2 of the second through-hole pattern HP2 in the first direction DR1 may be in a range of about 95% to about 105% of the width W_MSL2 of the second mesh line MSL2. For example, the maximum width W1_HP2 of the second through-hole pattern HP2 in the first direction DR1 may be equal to the width W_MSL2 of the second mesh line MSL2.

In one embodiment, the maximum width W2_HP2 of the second through-hole pattern HP2 in the second direction DR2 may be about 80% or more of the width W_MSL1 (see FIG. 8) of the first mesh line MSL1. For example, the maximum width W2_HP2 of the second through-hole pattern HP2 in the second direction DR2 may be in a range of about 95% to about 105% of the width W_MSL1 of the first mesh line MSL1. For example, the maximum width W2_HP2 of the second through-hole pattern HP2 in the second direction DR2 may be equal to the width W_MSL1 of the first mesh line MSL1.

Hereinafter, it will be described with reference to FIGS. 16 to 19 that degradation in visibility due to reflection of the external light L (see FIG. 1) may be prevented by the compensation pattern CP (see FIG. 7) and the through-hole pattern HP (see FIG. 7).

Figure 16:
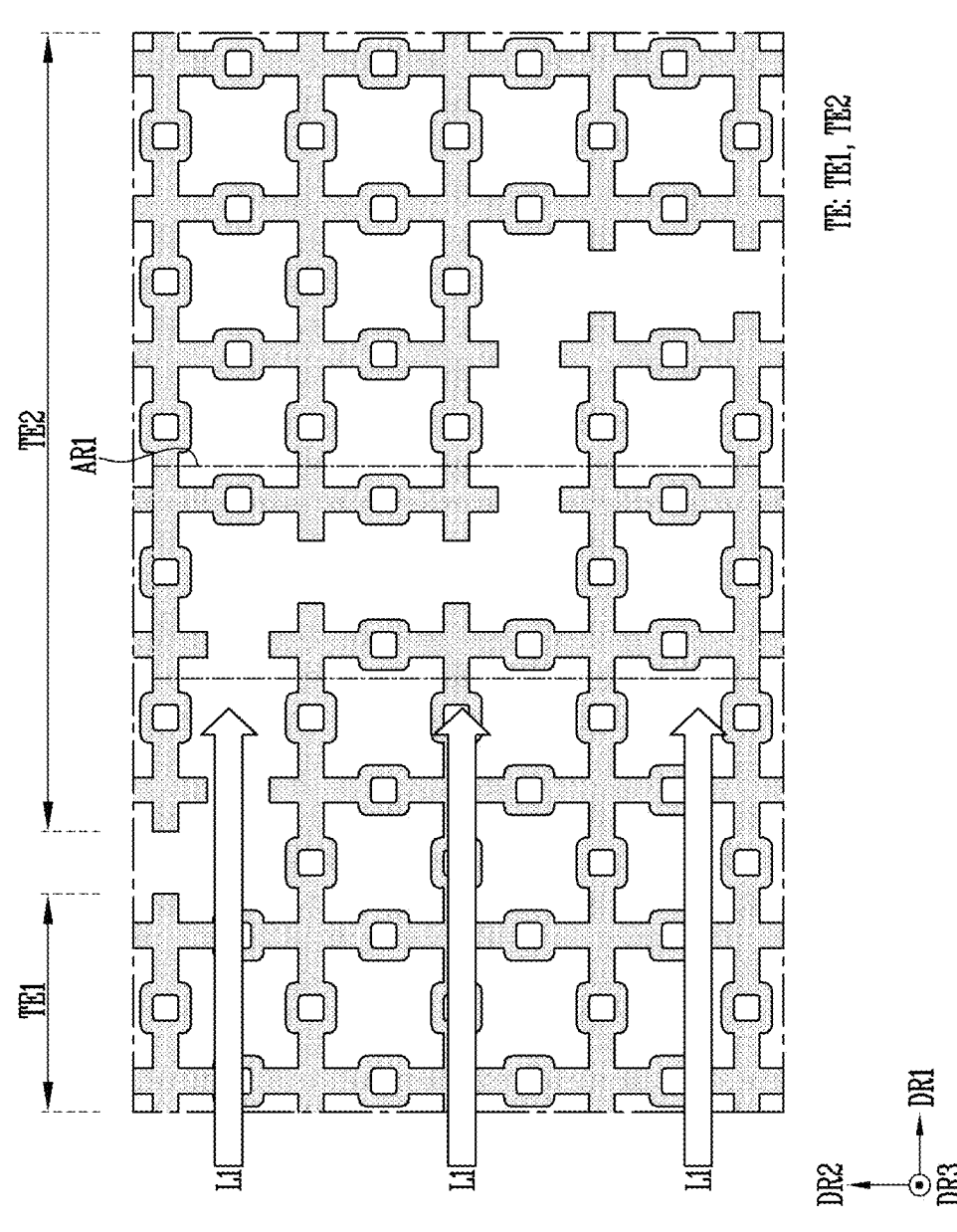
FIG. 16 is a plan view illustrating first external light incident on first areas of the first and second sensing electrodes of FIG. 7.
Figure 17:
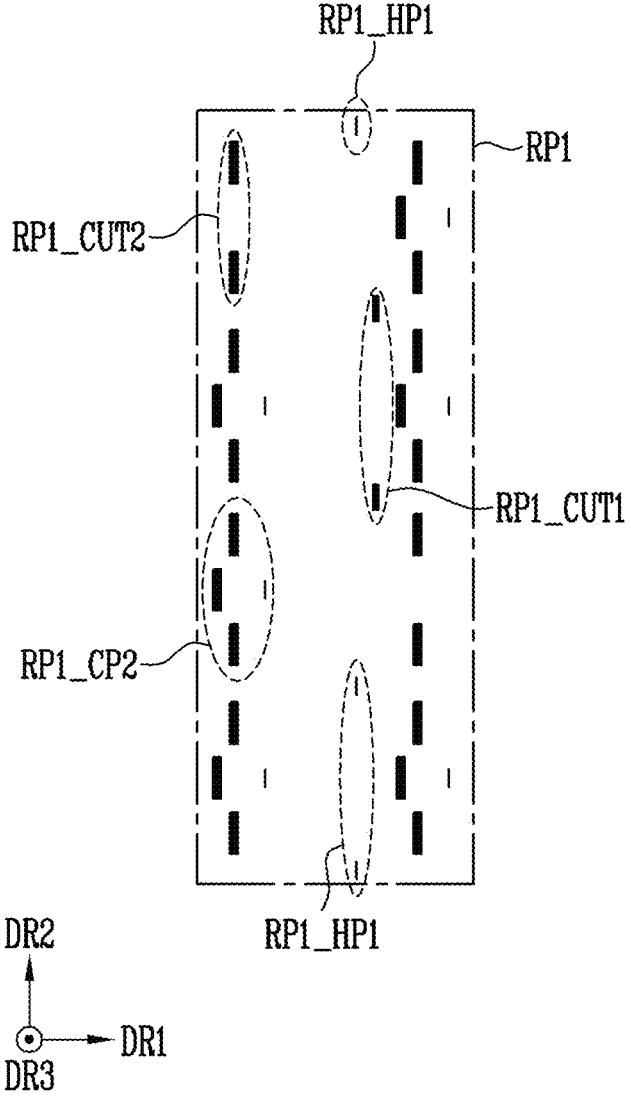
FIG. 17 is a plan view illustrating a first reflection pattern that is visible by the first external light being reflected in the first area of FIG. 16.

FIG. 16 is a plan view illustrating first external light incident on first areas of the first and second sensing electrodes of FIG. 7. FIG. 17 is a plan view illustrating a first reflection pattern that is visible by the first external light being reflected in the first area of FIG. 16.

Referring to FIGS. 16 and 17, in one embodiment, first external light L1 in the first direction DR1 or a direction intersecting the first direction DR1 may be incident on a first area AR1 of the sensing electrode TE. In this case, the first external light L1 may be reflected by side surfaces of the mesh lines MSL (see FIG. 7) disposed in the first area AR1 of the sensing electrode TE. The reflected first external light L1 may be visible as a first reflection pattern RP1.

The first reflection pattern RP1 may include a 1-1 reflection pattern RP1_CUT1. The 1-1 reflection pattern RP1_CUT1 may be a pattern that is visible by the external light L1 reflected by a side surface SSa (see FIG. 9) of the first mesh line MSL1 (see FIG. 8) defining the first cut point CUT1 (see FIG. 8).

The first reflection pattern RP1 may include a 1-2 reflection pattern RP1_HP1. The 1-2 reflection pattern RP1_HP1 may be a pattern that is visible by the first external light L1 reflected by an inner surface SSb (see FIG. 13) of the first compensation pattern CP1 (see FIG. 12) defining the first through-hole pattern HP1 (see FIG. 12).

The 1-1 reflection pattern RP1_CUT1 and the 1-2 reflection pattern RP1_HP1 may be generally arranged in the second direction DR2. In this case, the 1-2 reflection pattern RP1_HP1 may serve to lower the visibility of the 1-1 reflection pattern RP1_CUT1. For example, when it is assumed that there is no first through-hole pattern HP1, the 1-2 reflection pattern RP1_HP1 might not be present. In this case, the 1-1 reflection pattern RP1_CUT1 is prominently visible (for example, the 1-1 reflection pattern RP1_CUT1 is visible as a bright spot), which may cause a problem of degradation in visibility for a user of the display device DD. As such, in the present invention, the 1-2 reflection pattern RP1_HP1 may be implemented through the first through-hole pattern HP1, thereby preventing degradation in visibility caused by the 1-1 reflection pattern RP1_CUT1.

The first reflection pattern RP1 may include a 1-3 reflection pattern RP1_CUT2. The 1-3 reflection pattern RP1_CUT2 may be a pattern that is visible by the first external light L1 reflected by side surfaces of the second mesh line MSL2 (see FIG. 10) defining the second cut point CUT2 (see FIG. 10). In this case, since the first external light L1 is not reflected in an area in which the second cut point CUT2 is defined, an area in which the second cut point CUT2 is defined in the 1-3 reflection pattern RP1_CUT2 may be visible as a dark spot.

The first reflection pattern RP1 may include a 1-4 reflection pattern RP1_CP2. The 1-4 reflection pattern RP1_CP2 may be a pattern that is visible by the first external light L1 reflected by the second mesh line MSL2 in which the second cut point CUT2 is not defined. In this case, by the second compensation pattern CP2 (see FIG. 14) and the second through-hole pattern HP2 (see FIG. 14) defined in the second mesh line MSL2, the 1-4 reflection patterns RP1_CP2 may be visible in the form of discontinuous lines.

The 1-3 reflection pattern RP1_CUT2 and the 1-4 reflection pattern RP1_CP2 may be generally arranged in the second direction DR2. In this case, the 1-4 reflection pattern RP1_CP2 may serve to lower the visibility of a dark spot in the 1-3 reflection pattern RP1_CUT2. For example, when it is assumed that there is no second compensation pattern CP2 and second through-hole pattern HP2, the second mesh line MSL2 in which the second cut point CUT2 is not defined may be provided as a straight line (or an interconnect) extending in the second direction DR2. In this case, the 1-4 reflection pattern RP1_CP2 may be visible in the form of a continuous line, unlike what is shown in FIG. 17. Accordingly, a problem may occur in which the dark spot in the 1-3 reflection pattern RP1_CUT2 is prominently visible. In the present invention, the second mesh line MSL2 in which the second cut point CUT2 is not defined may include the second compensation pattern CP2 and the second through-hole pattern HP2, and thus the 1-4 reflection pattern RP1_CP2 may be visible in the form of discontinuous lines. Accordingly, it is possible to prevent degradation in visibility caused by the dark spot in the 1-3 reflection pattern RP1_CUT2.

Figure 18:
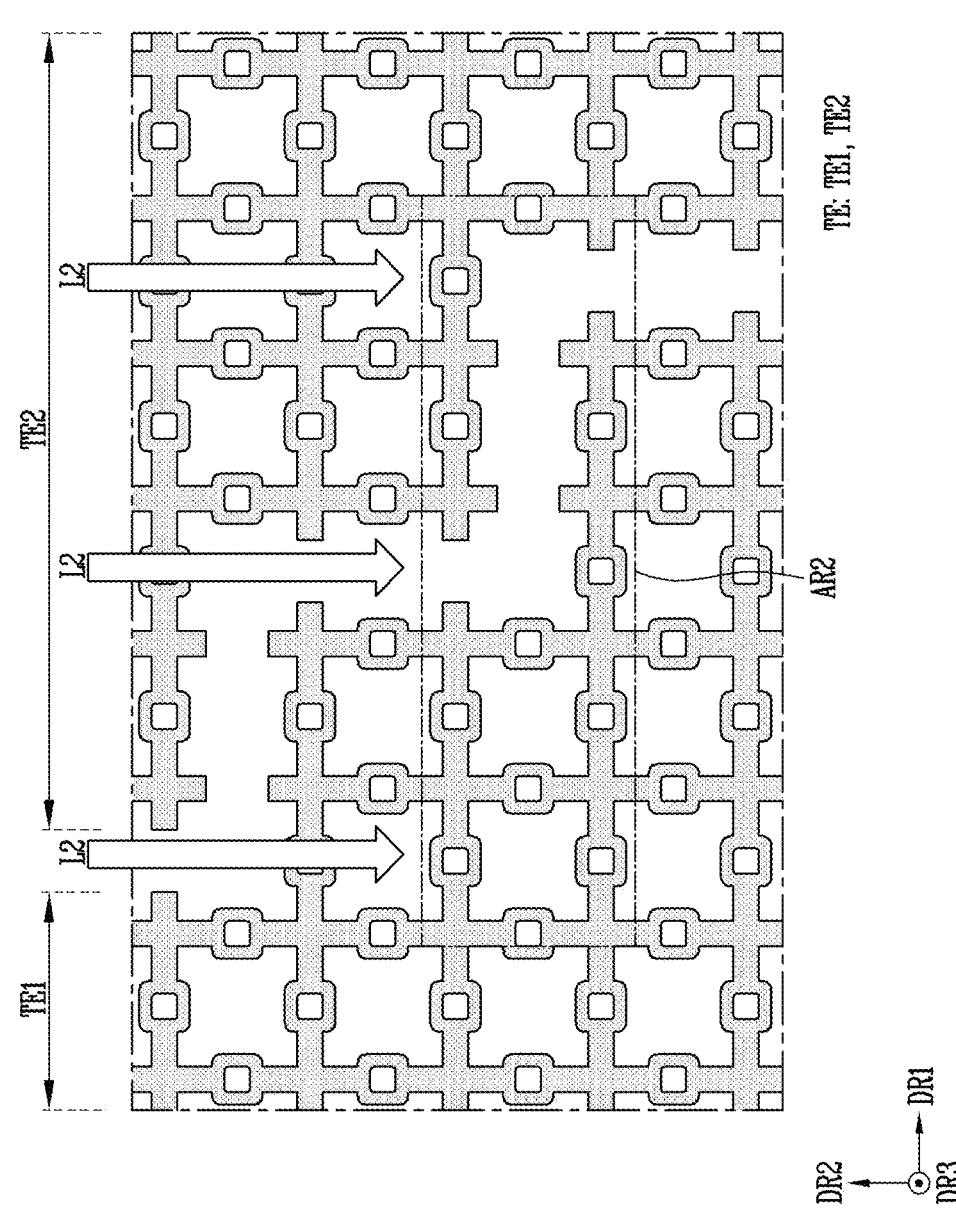
FIG. 18 is a plan view illustrating second external light incident on second areas of the first and second sensing electrodes of FIG. 7.
Figure 19:
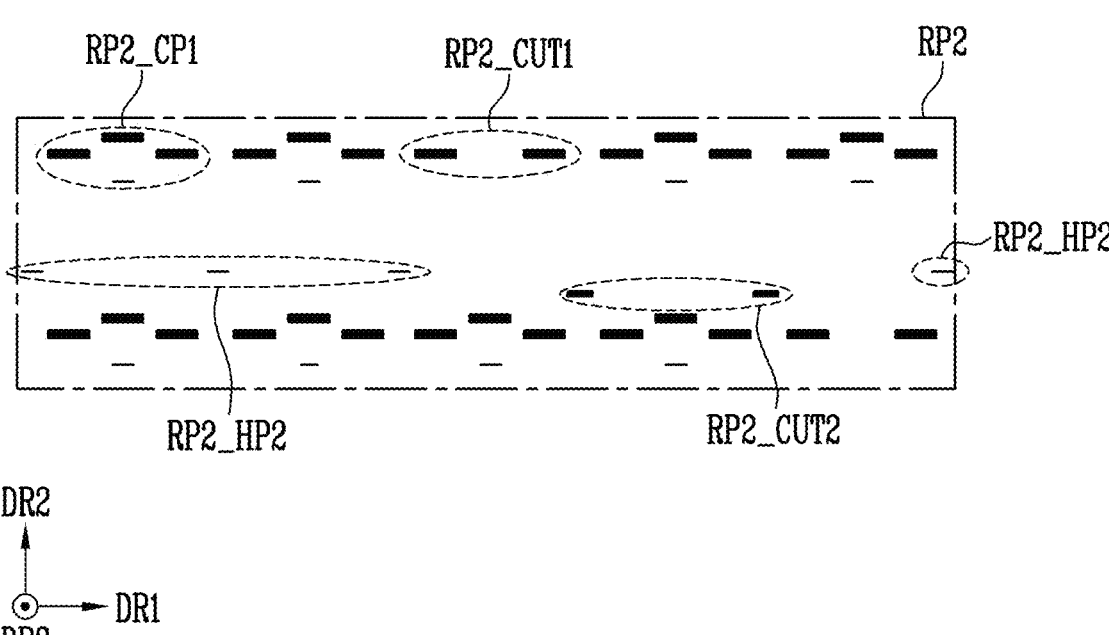
FIG. 19 is a plan view illustrating a first reflection pattern that is visible by the second external light being reflected in the second area of FIG. 18.

FIG. 18 is a view illustrating second external light incident on second areas of the first and second sensing electrodes of FIG. 7. FIG. 19 is a view illustrating a first reflection pattern that is visible by the second external light being reflected in the second area of FIG. 18.

Referring to FIGS. 18 and 19, in one embodiment, second external light L2 in a direction opposite to the second direction DR2 or a direction intersecting the direction opposite to the second direction DR2 may be incident on a second area AR2 of the sensing electrode TE. In this case, the second external light L2 may be reflected by side surfaces of the mesh lines MSL (see FIG. 7) disposed in the second area AR2 of the sensing electrode TE. The reflected second external light L2 may be visible as a second reflection pattern RP2.

The second reflection pattern RP2 may include a 2-1 reflection pattern RP2_CUT2. The 2-1 reflection pattern RP2_CUT2 may be a pattern that is visible by the second external light L2 reflected by a side surface SSc (see FIG. 11) of the second mesh line MSL2 (see FIG. 10) defining the second cut point CUT2 (see FIG. 10).

The second reflection pattern RP2 may include a 2-2 reflection pattern RP2_HP2. The 2-2 reflection pattern RP2_HP2 may be a pattern that is visible by the second external light L2 reflected by an inner surface SSd (see FIG. 15) of the second compensation pattern CP2 (see FIG. 14) defining the second through-hole pattern HP2 (see FIG. 14).

The 2-1 reflection pattern RP2_CUT2 and the 2-2 reflection pattern RP2_HP2 may be generally arranged in the first direction DR1. In this case, the 2-2 reflection pattern RP2_HP2 may serve to lower the visibility of the 2-1 reflection pattern RP2_CUT2. For example, when it is assumed that there is no second through-hole pattern HP2, the 2-2 reflection pattern RP2_HP2 might not be present. In this case, the 2-1 reflection pattern RP2_CUT2 is prominently visible (for example, the 2-1 reflection pattern RP2_CUT2 is visible as a bright spot), which may cause a problem of degradation in visibility for a user of the display device DD. As such, in the present invention, the 2-2 reflection pattern RP2_HP2 may be implemented through the second through-hole pattern HP2, thereby preventing degradation in visibility caused by the 2-1 reflection pattern RP2_CUT2.

The second reflection pattern RP2 may include a 2-3 reflection pattern RP2_CUT1. The 2-3 reflection pattern RP2_CUT1 may be a pattern that is visible by the second external light L2 reflected by side surfaces of the first mesh line MSL1 (see FIG. 8) defining the first cut point CUT1 (see FIG. 8). In this case, since the second external light L2 is not reflected in an area in which the first cut point CUT1 is defined, an area in which the first cut point CUT1 is defined in the 2-3 reflection pattern RP2_CUT1 may be visible as a dark spot.

The second reflection pattern RP2 may include a 2-4 reflection pattern RP2_CP1. The 2-4 reflection pattern RP2_CP1 may be a pattern that is visible by the second external light L2 reflected by the first mesh line MSL1 in which the first cut point CUT1 is not defined. In this case, by the first compensation pattern CP1 (see FIG. 12) and the first through-hole pattern HP1 (see FIG. 12) defined in the first mesh line MSL1, the 2-4 reflection pattern RP2_CP1 may be visible in the form of discontinuous lines.

The 2-3 reflection pattern RP2_CUT1 and the 2-4 reflection pattern RP2_CP1 may be generally arranged in the first direction DR1. In this case, the 2-4 reflection pattern RP2_CP1 may serve to lower the visibility of a dark spot in the 2-3 reflection pattern RP2_CUT1. For example, when it is assumed that there is no first compensation pattern CP1 and first through-hole pattern HP1, the first mesh line MSL1 in which the first cut point CUT1 is not defined may be provided as a straight line (or an interconnect) extending in the first direction DR1. In this case, the 2-4 reflection pattern RP2_CP1 may be visible in the form of a continuous line, unlike what is shown in FIG. 19. Accordingly, a problem may occur in which the dark spot in the 2-3 reflection pattern RP2_CUT1 is prominently visible. In the present invention, the first mesh line MSL1 in which the first cut point CUT1 is not defined may include the first compensation pattern CP1 and the first through-hole pattern HP1, and thus the 2-4 reflection pattern RP2_CP1 may be visible in the form of discontinuous lines. Accordingly, it is possible to prevent degradation in visibility caused by the dark spot in the 2-3 reflection pattern RP2_CUT1.

Referring again to FIGS. 16 to 19, when the first external light L1 and the second external light L2 are incident, the first and second compensation patterns CP1 and CP2 and the first and second through-hole pattern HP1 and HP2 may serve to compensate for the visibility of bright spots and dark spots shown by the first and second cut points CUT1 and CUT2. Accordingly, it is possible to effectively prevent degradation in visibility of the display device DD to which the sensing electrode TE of the present invention is applied.

Figure 20:
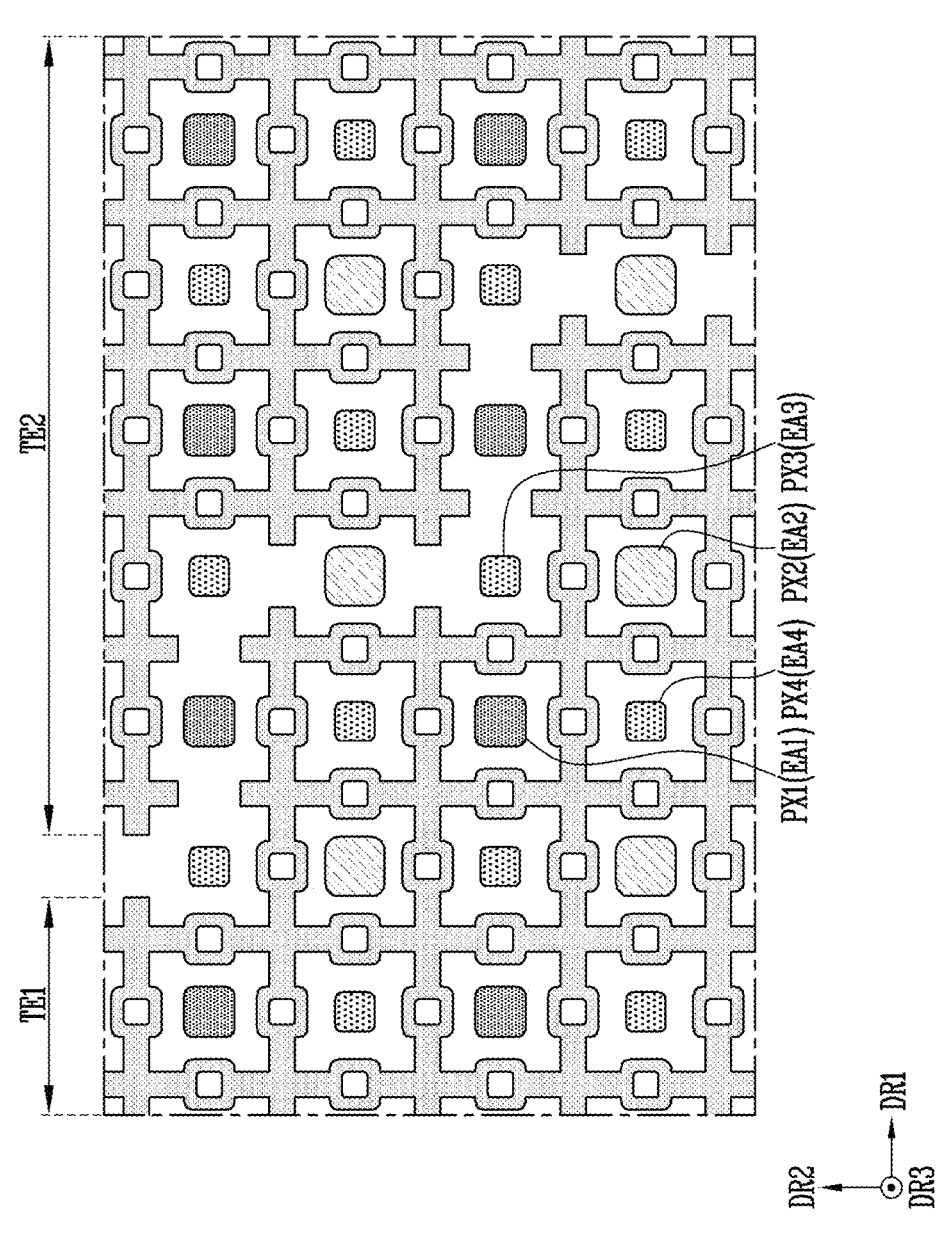
FIG. 20 is a plan view illustrating a planar arrangement of pixels included in the panel layer of FIG. 2 and the first and second sensing electrodes of FIG. 7.

FIG. 20 is a plan view illustrating a planar arrangement of the pixels included in the panel layer of FIG. 2 and the first and second sensing electrodes of FIG. 7.

Referring to FIG. 20, the first to fourth pixels PX1, PX2, PX3, and PX4 described with reference to FIG. 2 may be arranged in a matrix form in the first direction DR1 and the second direction DR2.

Each of the first to fourth pixels PX1, PX2, PX3, and PX4 may have the emission area EA (see FIG. 5). The first pixel PX1 may have a first emission area EA1. The second pixel PX2 may have a second emission area EA2. The third pixel PX3 may have a third emission area EA3. The fourth pixel PX4 may have a fourth emission area EA4. FIG. 20 illustrates the first to fourth emission areas EA1, EA2, EA3, and EA4 of the first to fourth pixels PX1, PX2, PX3, and PX4.

The first and second sensing electrodes TE1 and TE2 might not overlap the first to fourth emission areas EA1, EA2, EA3, and EA4 of the first to fourth pixels PX1, PX2, PX3, and PX4 in a plan view. For example, the mesh openings MOP (see FIG. 7) corresponding to the first to fourth pixels PX1, PX2, PX3, and PX4 may be defined in the mesh lines MSL (see FIG. 7) constituting the first and second sensing electrodes TE1 and TE2). Accordingly, light emitted from the first to fourth emission areas EA1, EA2, EA3, and EA4 of the first to fourth pixels PX1, PX2, PX3, and PX4 might not be substantially blocked by the first and second sensing electrodes TE1 and TE2.

Figure 21:
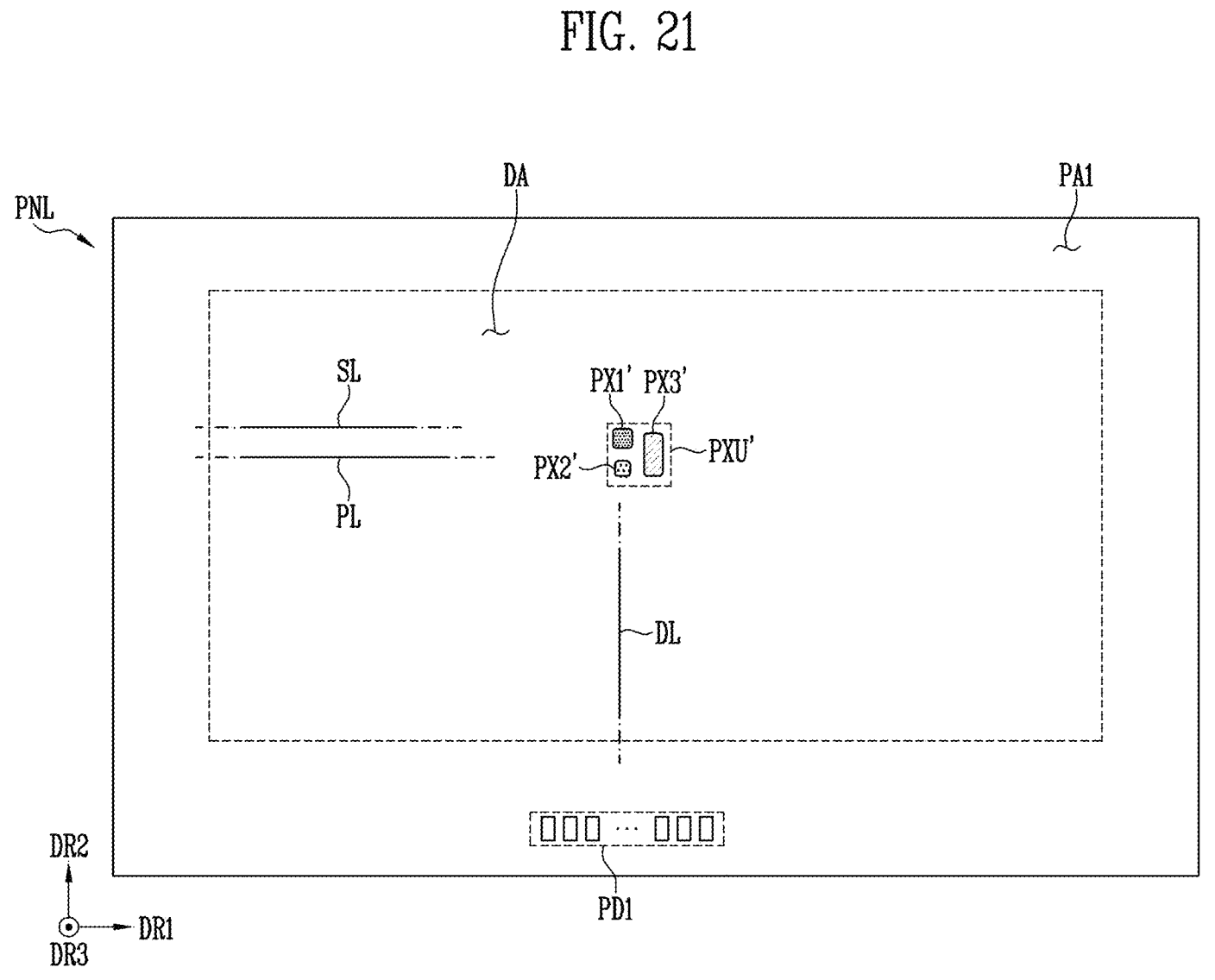

FIG. 21 is a plan view illustrating an embodiment of the panel layer of FIG. 2.

In the description with reference to FIG. 21, differences from the embodiments described with reference to FIGS. 3 to 5 will be mainly described, and to the extent that an element is not described in detail with respect to this figure, it may be understood that the element is at least similar to a corresponding element that has been described elsewhere within the present disclosure.

Referring to FIG. 21, in one embodiment, a unit pixel PXU' may include first to third pixels PX1', PX2', and PX3'. The first pixel PX1' may be spaced apart from the second pixel PX2' in a second direction DR2. The third pixel PX3' may be spaced apart from the first and second pixels PX1' and PX2' in the first direction DR1. A planar area of the first pixel PX1' may be substantially the same as (or similar to) a planar area of the second pixel PX2'. The first pixel PX1' may emit light with a first color, and the second pixel PX2' may emit light with a second color. A planar area of the third pixel PX3' may be greater than the planar area of each of the first and second pixels PX1' and PX2'. The third pixel PX3' may emit light with a third color.

Figure 22:
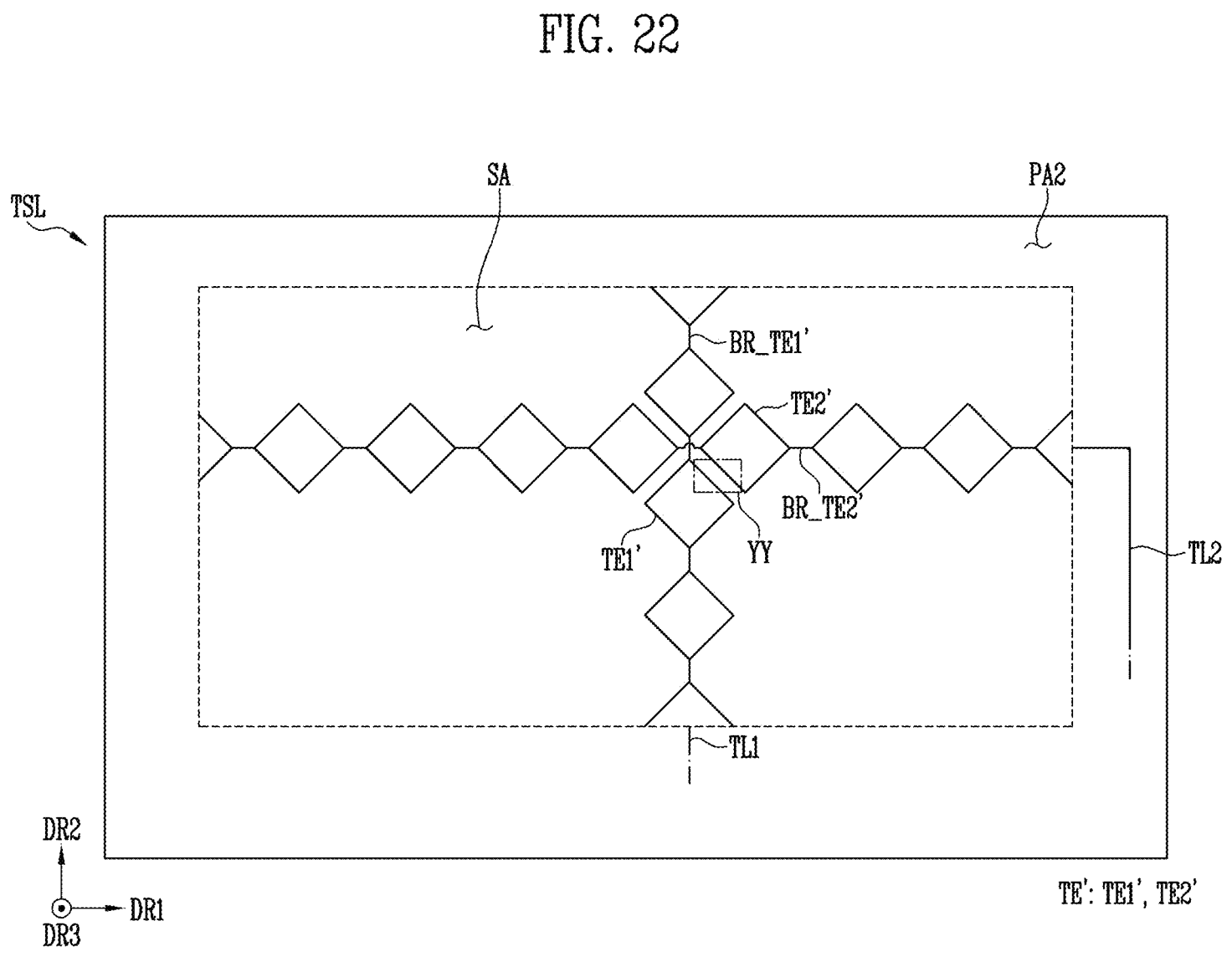

FIG. 22 is a plan view illustrating an embodiment of the input sensing layer of FIG. 2.

In the description with reference to FIG. 22, differences from the embodiment described with reference to FIG. 6 will be mainly described, and to the extent that an element is not described in detail with respect to this figure, it may be understood that the element is at least similar to a corresponding element that has been described elsewhere within the present disclosure.

Referring to FIG. 22, a sensing electrode TE' may be disposed in a sensing area SA of an input sensing layer TSL. The sensing electrode TE' may include a first sensing electrode TE1' and a second sensing electrode TE2'.

A plurality of first sensing electrodes TE1' may be provided in the sensing area SA, and the first sensing electrodes TE1' may be arranged in a second direction DR2. Two adjacent sensing electrodes TE1' may be electrically connected to each other by a first connection pattern BR_TE1'. A plurality of first connection patterns BR_TE1' may be provided in the sensing area SA. The first sensing electrodes TE1' arranged in the second direction DR2 and the first connection patterns BR_TE1' electrically connecting the first sensing electrodes TE1' may define a sensing column.

A plurality of second sensing electrodes TE2' may be provided in the sensing area SA, and the second sensing electrodes TE2' may be arranged in a first direction DR1. Two adjacent second sensing electrodes TE2' may be electrically connected to each other by a second connection pattern BR_TE2'. A plurality of second connection patterns BR_TE2' may be provided in the sensing area SA. The second sensing electrodes TE2' arranged in the first direction DR1 and the second connection patterns BR_TE2' electrically connecting the second sensing electrodes TE2' may define a sensing row.

A plurality of sensing columns may be provided in the sensing area SA. In this case, the sensing columns may be arranged in the first direction DR1. A plurality of sensing rows may be provided in the sensing area SA. In this case, the sensing rows may be arranged in the second direction DR2.

The first sensing electrodes TE1' constituting the sensing columns and the second sensing electrodes TE2' constituting the sensing rows may be implemented using any one conductive layer of the first and second sensing conductive layers TCL1 and TCL2 described with reference to FIG. 2. For example, the first sensing electrodes TE1' and the second sensing electrodes TE2' may consist of various types of patterns (or electrodes) formed of the first sensing conductive layer TCL1. Hereinafter, for convenience of description, it is assumed that the first sensing electrodes TE1' and the second sensing electrodes TE2' are formed of the first sensing conductive layer TCL1.

The first connection patterns BR_TE1' constituting the sensing columns and the second connection patterns BR_TE2' constituting the sensing rows may be insulated from and intersected with each other. For example, the first connection patterns BR_TE1' may be formed of the first sensing conductive layer TCL1 described with reference to FIG. 2, and the second connection patterns BR_TE2' may be formed of the second sensing conductive layer TCL2. In this case, the first connection patterns BR_TE1' may be formed integrally with the first sensing electrodes TE1, and the second connection patterns BR_TE2' may be in electrical contact with the second sensing electrodes TE2 through through-holes passing through the second insulating layer TIL2 described with reference to FIG. 2.

In embodiments, the sensing columns may be electrically insulated from the sensing rows. For example, the first sensing electrodes TE1' and the second sensing electrodes TE2' may be disposed so as not to overlap each other in a plan view, and at least one insulating layer (for example, TIL2 in FIG. 2) may be interposed between the first connection patterns BR_TE1 and the second connection patterns BR_TE2.

The sensing columns and the sensing rows may serve to detect a touch input of a user of a display device DD and a position thereof. For example, when a touch input of a user is performed at a specific position, the mutual capacitance between the sensing columns and the sensing rows at the position may change (for example, may decrease). Such a change in mutual capacitance may be transmitted to a touch processor disposed in a second peripheral area PA2 or a first peripheral area PA1 (see FIG. 3) through a first transmission interconnect TL1 connected to the sensing column and a second transmission interconnect TL2 connected to the sensing row. Accordingly, the touch processor may detect a touch input of a user of the display device DD and a position thereof.

Figure 23:
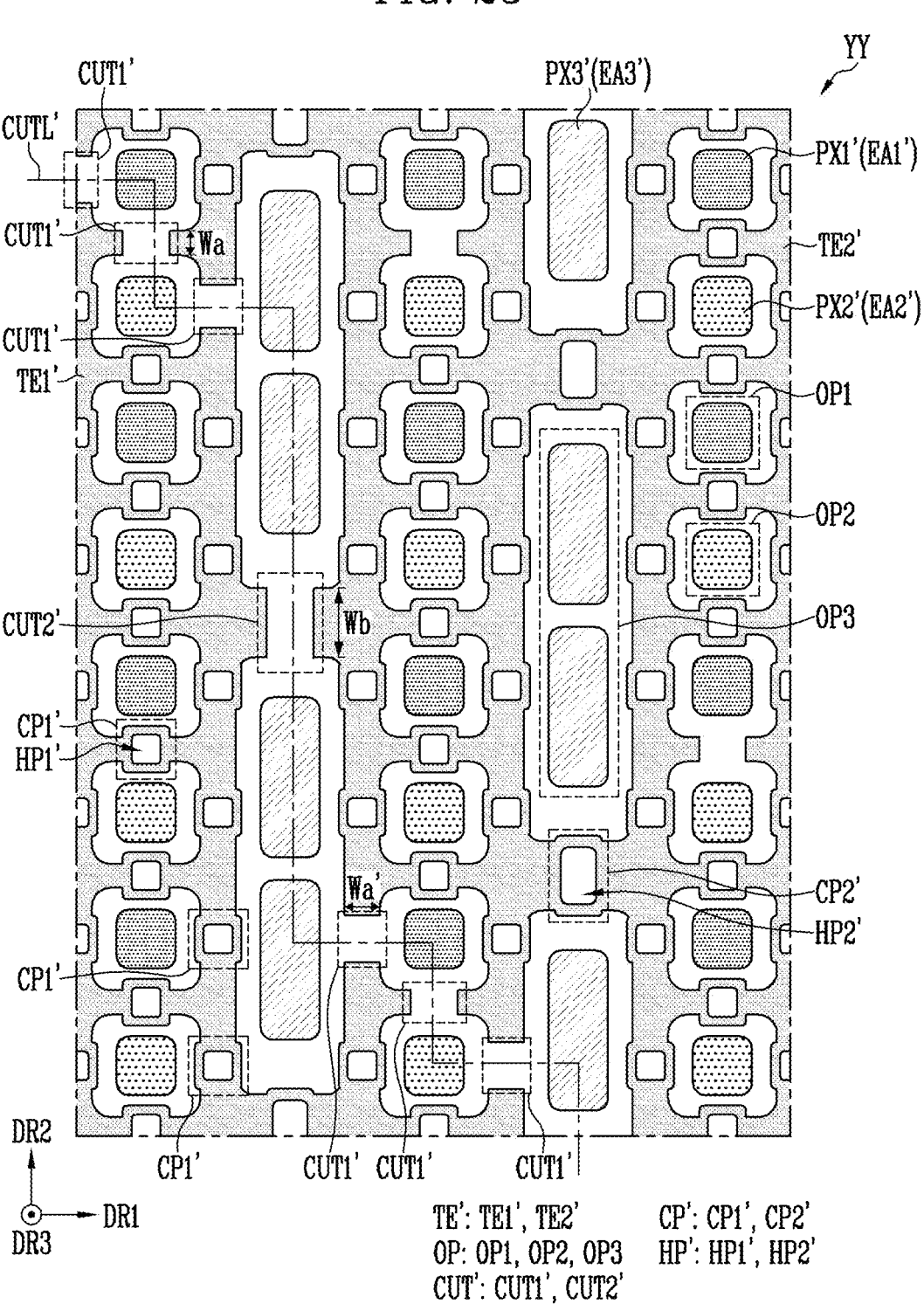
FIG. 23 is a plan view illustrating a planar arrangement of pixels included in the panel layer of FIG. 21 and first and second sensing electrodes of FIG. 22.

FIG. 23 is a plan view illustrating a planar arrangement of the pixels included in the panel layer of FIG. 21 and the first and second sensing electrodes of FIG. 22. FIG. 23 is an enlarged plan view of area YY of FIG. 22.

Referring to FIG. 23, a plurality of first pixels PX1', a plurality of second pixels PX2', and a plurality of third pixels PX3' may be provided. The first to third pixels PX1', PX2', and PX3' may be arranged according to certain rules.

The sensing electrode TE' may define openings OP corresponding to the first to third pixels PX1', PX2', and PX3'. For example, the sensing electrode TE' may define a first opening OP1 corresponding to the first pixel PX1', a second opening OP2 corresponding to the second pixel PX2', and a third opening OP3' corresponding to the third pixel PX3'.

A plurality of first openings OP1 may be provided. The first openings OP1 may correspond one-to-one to the first pixels PX1'. The first openings OP1 may overlap the first pixels PX1' in a plan view. Accordingly, light emitted from a first emission area EA1' of each of the first pixels PX1' might not be substantially blocked by the sensing electrode TE'.

A plurality of second openings OP2 may be provided. The second openings OP2 may correspond one-to-one to the second pixels PX2'. The second openings OP2 may overlap the second pixels PX2' in a plan view. Accordingly, light emitted from a second emission area EA2' of each of the second pixels PX2' might not be substantially blocked by the sensing electrode TE'.

A plurality of third openings OP3 may be provided. The third opening OP3 may be provided one-by-one to two adjacent third pixels PX3'. The third opening OP3 may overlap two adjacent third pixels PX3' in a plan view. Accordingly, light emitted from a third emission areas EA3' of each of the third pixels PX3' might not be substantially blocked by the sensing electrode TE'.

In one embodiment, a planar area of the third opening OP3 may be greater than a planar area of the first opening OP1. In addition, the planar area of the third opening OP3 may be greater than a planar area of the second opening OP2.

In some openings of the openings OP, a cut point CUT' may be defined in the sensing electrode TE' positioned in an area between two adjacent openings to connect the two adjacent openings. A plurality of cut points CUT' may be defined. For example, the cut points CUT' may be defined along a cutting line CUTL' shown in FIG. 23. The sensing electrode TE' may be divided into a first sensing electrode TE1' and a second sensing electrode TE2' by the cut points CUT'.

The cut point CUT' may include first cut points CUT1' and second cut points CUT2'. The first cut points CUT1' may be defined between the first openings OP1 and the second opening OP2 adjacent to each other, between the first opening OP1 and the third opening OP3 adjacent to each other, and between the second opening OP2 and the third opening OP3 adjacent to each other. By the first cut points CUT1', the first opening OP1 and the second opening OP2 adjacent to each other may be connected, the first opening OP1 and the third opening OP3 adjacent to each other may be connected, and the second opening OP2 and the third opening OP3 adjacent to each other may be connected. The second cut points CUT2' may be defined between two adjacent third openings OP3. Two adjacent third openings OP3 adjacent to each other may be connected by the second cut points CUT2'.

In one embodiment, a width of the sensing electrode TE' in an area in which the first cut points CUT1' is defined may be smaller than a width of the sensing electrode TE' in an area in which the second cut points CUT2' are defined. For example, each of widths Wa and Wa' of the sensing electrode TE' in the area where the first cut points CUT1' are defined may be smaller than a width Wb of the sensing electrode TE1 in the area in which the second cut points CUT2' are defined.

Between two adjacent openings among the openings OP, a compensation pattern CP' protruding from side surfaces of the sensing electrode TE' may be defined in the sensing electrode TE' positioned in an area in which the cut point CUT' is not defined. The compensation pattern CP' may include a through-hole pattern HP' positioned at a central portion of the compensation pattern CP'.

For example, in the sensing electrode TE' positioned in the area where the cut point CUT' is not defined, a first compensation pattern CP1' may be defined between the first opening OP1 and the second opening OP2 adjacent to each other, between the first opening OP1 and the third opening OP3 adjacent to each other, and between the second opening OP2 and the third opening OP3 adjacent to each other. In addition, in the sensing electrode TE' positioned in the area in which the cut point CUT' is not defined, a second compensation pattern CP2' may be defined between two adjacent third openings OP3'.

In one embodiment, the first compensation pattern CP1' may have a quadrilateral shape with rounded corners in a plan view. However, the planar shape of the first compensation pattern CP1' is not necessarily limited thereto. The first compensation pattern CP1' may have various shapes without limitation. For example, the first compensation pattern CP1' may have a circular shape, a polygonal shape, or a polygonal shape with rounded corners.

In one embodiment, the second compensation pattern CP2' may have a quadrilateral shape with rounded corners in a plan view. However, the planar shape of the second compensation pattern CP2' is not necessarily limited thereto. The second compensation pattern CP2' may have various shapes without limitation. For example, the second compensation pattern CP2' may have a circular shape, a polygonal shape, or a polygonal shape with rounded corners.

The first compensation pattern CP1' may include a first through-hole pattern HP1' positioned at a central portion of the first compensation pattern CP1'. Illustrating, the first through-hole pattern HP1' may be surrounded by the first compensation pattern CP1' to have a closed curve shape in a plan view. The first through-hole pattern HP1' may be a pattern corresponding to a through-hole passing through the first compensation pattern CP1' in a third direction DR3.

Illustrating, in an area in which the first through-hole pattern HP1' is defined, a first insulating layer TIL1 (see FIG. 2) and a second insulating layer TIL2 (see FIG. 2) may be in direct contact with each other.

In one embodiment, the first through-hole pattern HP1' may have a quadrilateral shape with rounded corners in a plan view. However, the planar shape of the first through-hole pattern HP1' is not necessarily limited thereto. The first through-hole pattern HP1' may have various shapes without limitation. For example, the first through-hole pattern HP1' may have a circular shape, a polygonal shape, or a polygonal shape with rounded corners.

In one embodiment, the maximum width of the first through-hole pattern HP1' in the first direction DR1 may be about 80% or more of each of the widths Wa and Wa' of the sensing electrode TE' in the area in which the first cut points CUT1' are defined. For example, the maximum width of the first through-hole pattern HP1' in the first direction DR1 may be in a range of about 95% to 105% of each of the widths Wa and Wa' of the sensing electrode TE' in the area in which the first cut points CUT1' are defined.

In one embodiment, the maximum width of the first through-hole pattern HP1' in the second direction DR2 may be about 80% or more of each of the widths Wa and Wa' of the sensing electrode TE' in the area in which the first cut points CUT1' are defined. For example, the maximum width of the first through-hole pattern HP1' in the second direction DR2 may be in a range of about 95% to 105% of each of the widths Wa and Wa' of the sensing electrode TE' in the area in which the first cut points CUT1' are defined.

The second compensation pattern CP2' may include a second through-hole pattern HP2' positioned at a central portion of the second compensation pattern CP2'. Illustrating, the second through-hole pattern HP2' may be surrounded by the second compensation pattern CP2' to have a closed curve shape in a plan view. The second through-hole pattern HP2' may be a pattern corresponding to a through-hole passing through the second compensation pattern CP2' in the third direction DR3. Illustrating, in an area in which the second through-hole pattern HP2' is defined, the first insulating layer TIL1 (see FIG. 2) and the second insulating layer TIL2 (see FIG. 2) may be in direct contact with each other.

In one embodiment, the second through-hole pattern HP2' may have a quadrilateral shape with rounded corners in a plan view. However, the planar shape of the second through-hole pattern HP2' is not necessarily limited thereto. The second through-hole pattern HP2' may have various shapes without limitation. For example, the second through-hole pattern HPP' may have a circular shape, a polygonal shape, or a polygonal shape with rounded corners.

In one embodiment, the maximum width of the second through-hole pattern HP2' in the first direction DR1 may be about 80% or more of each of the widths Wa and Wa' of the sensing electrode TE' in the area in which the first cut points CUT1' are defined. For example, the maximum width of the second through-hole pattern HP2' in the first direction DR1 may be in a range of about 95% to about 105% of each of the widths Wa and Wa' of the sensing electrode TE' in the area in which the first cut points CUT1' are defined.

In one embodiment, the maximum width of the second through-hole pattern HP2' in the second direction DR2 may be about 80% or more of the width Wb of the sensing electrode TE' in the area in which the second cut points CUT2' are defined. For example, the maximum width of the second through-hole pattern HP2' in the second direction DR2 may be in a range of about 95% to about 105% of the width Wb of the sensing electrode TE' in the area in which the second cut points CUT2' are defined.

In one embodiment, a planar area of the first through-hole pattern HP1' may be smaller than a planar area of the second through-hole pattern HP2'. For example, the maximum width of the first through-hole pattern HP1' in the first direction DR1 may be substantially equal to the maximum width of the second through-hole pattern HP2' in the first direction DR1. The maximum width of the first through-hole pattern HP1' in the second direction DR2 may be smaller than the maximum width of the second through-hole pattern HP2' in the second direction DR2.

Referring again to FIG. 23, the first and second compensation patterns CP1' and CP2' and the first and second through-hole patterns HP1' and HP2' may play substantially the same (or similar) role as the first and second compensation patterns CP1 and CP2 and the first and second through-hole patterns HP1 and HP2 described with reference to FIGS. 16 to 19. Illustrating, when first external light L1 (see FIG. 16) and second external light L2 (see FIG. 18) are incident, the first and second compensation patterns CP1' and CP2' and the first and second through-hole pattern HP1' and HP2' may serve to compensate for the visibility of bright spots and dark spots shown by the first and second cut points CUT1 and CUT2.

As such, a sensing electrode having first and second compensation patterns and first and second through-hole patterns of the present invention may be variously modified and applied to pixels having various arrangements.

Figure 24:
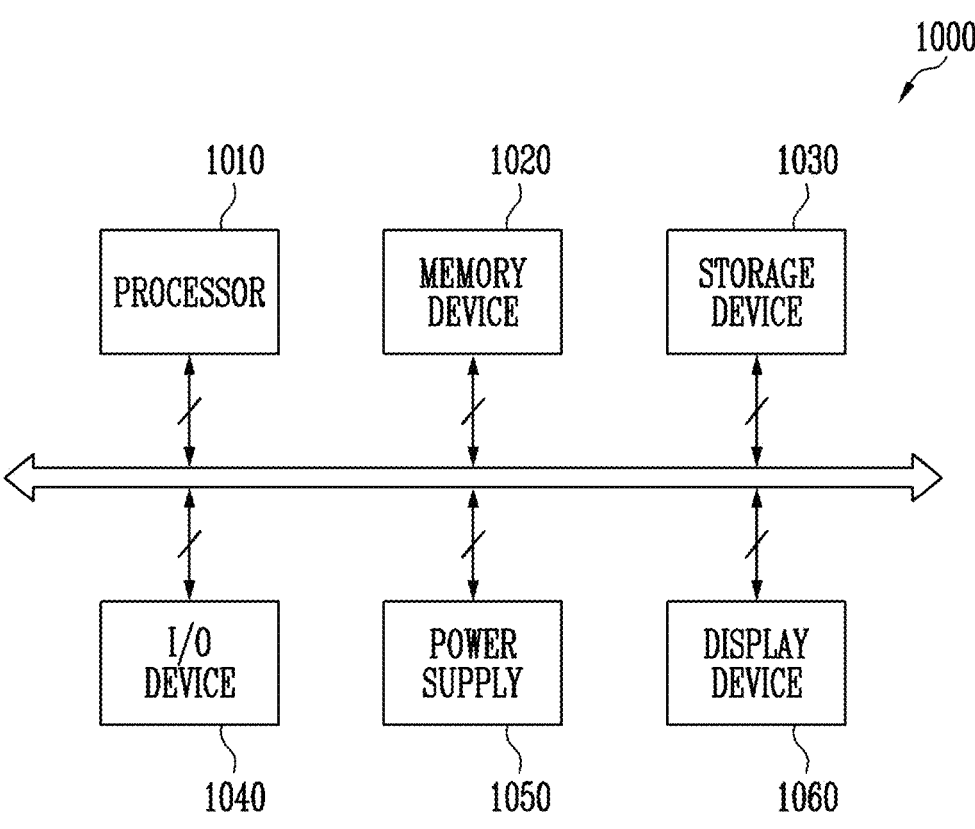
FIG. 24 is a schematic view illustrating an electronic device including a display device according to embodiments of the present invention.
Figure 25:
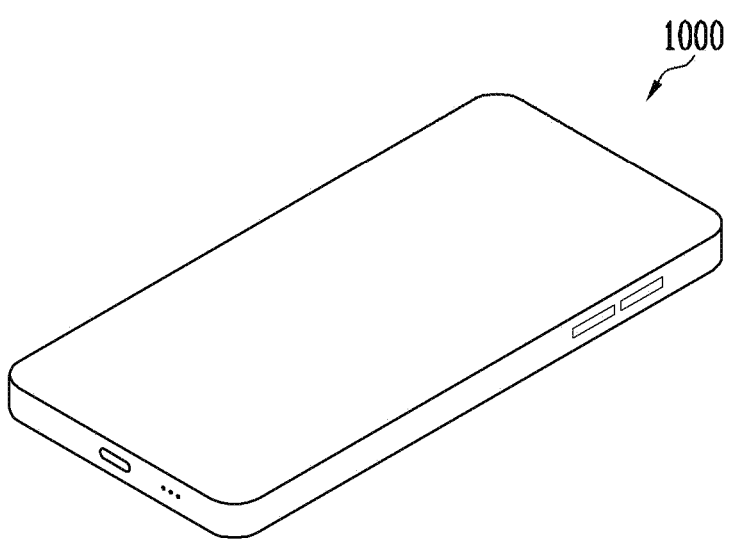
FIG. 25 is a perspective view illustrating an example in which the electronic device of FIG. 24 is implemented as a smartphone.
Figure 26:
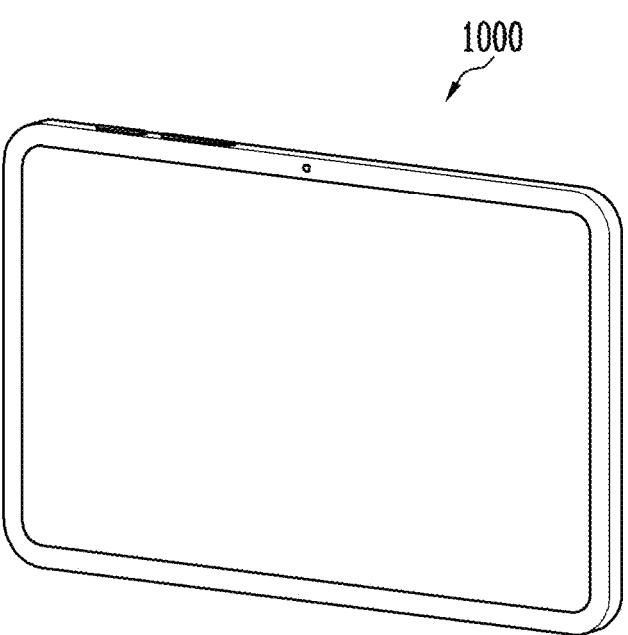
FIG. 26 is a perspective view illustrating an example in which the electronic device of FIG. 24 is implemented as a tablet computer.

FIG. 24 is a schematic view illustrating an electronic device including a display device according to embodiments of the present invention. FIG. 25 is a perspective view illustrating an example in which the electronic device of FIG. 24 is implemented as a smartphone. FIG. 26 is a perspective view illustrating an example in which the electronic device of FIG. 24 is implemented as a tablet computer.

Referring to FIGS. 24 to 26, an electronic device 1000 may include a processor 1010, a memory device 1020, a storage device 1030, an input/output device 1040, a power supply 1050, and a display device 1060. The display device 1060 may be the display device DD described with reference to FIG. 1. In addition, the electronic device 1000 may further include various ports that may communicate with a video card, a sound card, a memory card, a universal serial bus (USB) device, and the like, or may communicate with other systems. In one embodiment, as shown in FIG. 25, the electronic device 1000 may be implemented as a smartphone. In an embodiment, as shown in FIG. 26, the electronic device 1000 may be implemented as a tablet computer. However, this is merely an example, and the electronic device 1000 is not necessarily limited to the above-described embodiments. For example, the electronic device 1000 may be implemented as a mobile phone, a video phone, a smart pad, a smart watch, a vehicle navigation device, a computer monitor, a laptop computer, a head mounted display device, or the like.

The processor 1010 may perform specific calculations or tasks. According to embodiments, the processor 1010 may be a microprocessor, a central processing unit, an application processor, or the like. The processor 1010 may be connected to other components through an address bus, a control bus, and a data bus. According to embodiments, the processor 1010 may also be connected to an expansion bus such as a peripheral component interconnect (PCI) bus. According to embodiments, the processor 1010 may provide input image data to the display device 1060, and accordingly, the display device 1060 may display an image based on the input image data provided from the processor 1010.

The memory device 1020 may store data necessary for the operation of the electronic device 1000. For example, the memory device 1020 may include non-volatile memory devices such as an erasable programmable read-only memory (EPROM) device, an electrically erasable programmable read-only memory (EEPROM) device, a flash memory device, a phase change random access memory (PRAM) device, a resistance random access memory (RRAM) device, a nano-floating gate memory (NFGM) device, a polymer random access memory (PoRAM) device, a magnetic random access memory (MRAM) device, and a ferroelectric random access memory (FRAM) device, and/or volatile memory devices such as a dynamic random access memory (DRAM) device, a static random access memory (SRAM) device, and a mobile DRAM device.

The storage device 1030 may include a solid state drive (SSD), a hard disk drive (HDD), a CD-ROM, and the like.

The input/output device 1040 may include an input means such as a keyboard, a keypad, a touchpad, a touch screen, or a mouse and an output means such as a speaker or a printer. According to embodiments, the input/output device 1040 may be implemented integrally with the display device 1060.

The power supply 1050 may supply power necessary for the operation of the electronic device 1000. For example, the power supply 1050 may be a power management integrated circuit (PMIC). According to embodiments, the power supply 1050 may supply power to the display device 1060.

The display device 1060 may display an image corresponding to visual information of the electronic device 1000. The display device 1060 may be connected to other components through the buses or other communication links.

According to embodiments of the present invention, a sensing electrode may include a compensation pattern and a through-hole pattern for compensating for the visibility of a bright spot and/or a dark spot caused by reflection of external light at a cut point. Accordingly, the visibility of a display device and an electronic device including the display device may be increased.

While the present invention has been described with reference to embodiments, it will be understood by those skilled in the art that various changes and modifications may be made without departing from the spirit and scope of the present disclosure.

What is claimed is:

1. A display device, comprising:
a panel layer including pixels disposed in a display area of the panel layer; and
an input sensing layer disposed on the panel layer and including a sensing electrode, the sensing electrode including mesh lines defining mesh openings corresponding to the pixels,
wherein the mesh lines include first mesh lines extending in a first direction and second mesh lines extending in a second direction intersecting the first direction,
wherein the first mesh lines and the second mesh lines intersect each other at intersection points, wherein, in some mesh lines of the mesh lines, a cut point is defined between two adjacent intersection points,
wherein, in a mesh line in which the cut point is not defined between two adjacent intersection points among the mesh lines, a compensation pattern is formed by a widening of the side surfaces of the mesh line, and wherein the compensation pattern includes a through-hole pattern positioned at a central portion of the compensation pattern that extends through the mesh line.

2. The display device of claim 1, wherein the mesh lines do not overlap emission areas of the pixels in a plan view.

3. The display device of claim 1, wherein the sensing electrode is divided into a first sensing electrode and a second sensing electrode by the cut point.

4. The display device of claim 1, wherein a maximum width of the through-hole pattern in the first direction is 80% or more of a width of each of the second mesh lines in the first direction.

5. The display device of claim 1, wherein a maximum width of the through-hole pattern in the second direction is 80% or more of a width of each of the first mesh lines in the second direction.

6. The display device of claim 1, wherein the compensation pattern has a quadrilateral shape with rounded corners in a plan view.

7. The display device of claim 1, wherein the through-hole pattern has a circular shape, a polygonal shape, or a polygonal shape with rounded corners, in a plan view.

8. The display device of claim 1, wherein the cut point includes first cut points defined in the first mesh lines and second cut points defined in the second mesh lines, and
   wherein the compensation pattern includes first compensation patterns defined in the first mesh lines and second compensation patterns defined in the second mesh lines.

9. The display device of claim 8, wherein, in the mesh lines, the first cut points and the first compensation patterns are arranged in a line in the second direction.

10. The display device of claim 8, wherein, in the mesh lines, the second cut points and the second compensation patterns are arranged in a line in the first direction.

11. The display device of claim 1, wherein the pixels are arranged in a matrix form in the first direction and the second direction.

12. A display device, comprising:
   a panel layer including pixels arranged in a display area of the panel layer;
   an input sensing layer disposed on the panel layer and including a sensing electrode, the sensing electrode defining openings corresponding to the pixels,
   wherein, in some openings of the openings, a cut point is defined in the sensing electrode positioned in an area between two adjacent openings to connect the two adjacent openings with one another,
   wherein, between the two adjacent openings among the openings, a compensation pattern is formed by a widening of the side surfaces of the sensing electrode in an area in which the cut point is not defined, and
   wherein, the compensation pattern includes a through-hole pattern positioned at a central portion of the compensation pattern that extends through the sensing electrode.

13. The display device of claim 12, wherein the sensing electrode does not overlap emission areas of the pixels in a plan view.

14. The display device of claim 12, wherein the sensing electrode is divided into a first sensing electrode and a second sensing electrode by the cut point.

15. The display device of claim 12, wherein the openings include first openings, second openings, and third openings, and
   wherein, a planar area of each of the third openings is greater than a planar area of each of the first openings and a planar area of each of the second openings.

16. The display device of claim 15, wherein the cut point includes a first cut point defined between each of the first openings and an adjacent one of the second openings, between each of the first openings and an adjacent one of the third openings, and between each of the second openings and an adjacent one of the third openings, and a second cut point defined between the third openings adjacent to each other.

17. The display device of claim 16, wherein a width of the sensing electrode in an area in which the first cut point is defined is smaller than a width of the sensing electrode in an area in which the second cut point is defined.

18. The display device of claim 16, wherein the compensation pattern includes a first compensation pattern defined between each of the first openings and an adjacent one of the second openings, between each of the first openings and an adjacent one of the third openings, and between each of the second openings and an adjacent one of the third openings, and a second compensation pattern defined between two third openings adjacent to each other.

19. The display device of claim 18, wherein a planar area of a first through-hole pattern positioned at a central portion of the first compensation pattern is smaller than a planar area of a second through-hole pattern positioned at a central portion of the second compensation pattern.

20. An electronic device, comprising:
   a processor configured to provide input image data;
   a display device configured to display an image based on the input image data; and
   a power supply configured to supply power to the display device,
   wherein the display device includes:
      a panel layer including pixels disposed in a display area; and
      an input sensing layer disposed on the panel layer and including a sensing electrode, the sensing electrode including mesh lines defining mesh openings corresponding to the pixels,
   wherein the mesh lines include first mesh lines extending in a first direction and second mesh lines extending in a second direction intersecting the first direction,
   wherein the first mesh lines and the second mesh lines intersect each other at intersection points,
   wherein, in some mesh lines of the mesh lines, a cut point is defined between two adjacent intersection points,
   wherein, in a mesh line in which the cut point is not defined between two adjacent intersection points among the mesh lines, a compensation pattern is formed by a widening of the side surfaces of the mesh line, and
   wherein, the compensation pattern includes a through-hole pattern positioned at a central portion of the compensation pattern that extends through the mesh line.

* * * * *